United States Patent
Uchida et al.

(10) Patent No.: US 12,399,116 B2
(45) Date of Patent: Aug. 26, 2025

(54) DETERMINATION METHOD AND TREATMENT METHOD

(71) Applicants: KABUSHIKI KAISHA TOSHIBA, Tokyo (JP); Kioxia Corporation, Tokyo (JP); TOHOKU UNIVERSITY, Sendai (JP)

(72) Inventors: Kenya Uchida, Yokohama (JP); Hiroyuki Fukui, Yokkaichi (JP); Ikuo Uematsu, Yokohama (JP); Takeaki Iwamoto, Sendai (JP); Eunsang Kwon, Sendai (JP)

(73) Assignees: KABUSHIKI KAISHA TOSHIBA, Tokyo (JP); Kioxia Corporation, Tokyo (JP); TOHOKU UNIVERSITY, Sendai (JP)

( * ) Notice: Subject to any disclaimer, the term of this patent is extended or adjusted under 35 U.S.C. 154(b) by 818 days.

(21) Appl. No.: 17/305,473

(22) Filed: Jul. 8, 2021

(65) Prior Publication Data

US 2021/0341384 A1   Nov. 4, 2021

Related U.S. Application Data

(63) Continuation of application No. PCT/JP2020/001104, filed on Jan. 15, 2020.

(30) Foreign Application Priority Data

Jan. 25, 2019   (JP) .................................. 2019-011524

(51) Int. Cl.
   *G01N 21/3563*   (2014.01)
   *C01B 33/107*   (2006.01)
   (Continued)

(52) U.S. Cl.
   CPC ....... *G01N 21/3563* (2013.01); *C01B 33/107* (2013.01); *G01N 21/65* (2013.01);
   (Continued)

(58) Field of Classification Search
   CPC .. G01N 21/3563; G01N 21/65; G01N 24/088; G01N 2201/06113; G01N 21/35;
   (Continued)

(56) References Cited

U.S. PATENT DOCUMENTS

| 2009/0110622 A1* | 4/2009 | Chiu ...................... B01D 53/38 |
| | | 422/111 |
| 2012/0052203 A1 | 3/2012 | Miyashita et al. |

(Continued)

FOREIGN PATENT DOCUMENTS

| JP | 01-257119 A | 10/1989 |
| JP | 04-124011 A | 4/1992 |

(Continued)

OTHER PUBLICATIONS

Ignatyev, Vibrational spectra of trimethylsilanol The problem of the assignment of the SiOH group frequencies, 2004, Spectrochimica Acta Part A 60 (2004) 1169-1178 (Year: 2004).*

(Continued)

*Primary Examiner* — Maris R Kessel
*Assistant Examiner* — Alerie Simmons
(74) *Attorney, Agent, or Firm* — Oblon, McClelland, Maier & Neustadt, L.L.P.

(57) ABSTRACT

According to one embodiment, a determination method is provided. The determination method determines progress of a treatment of a side-product produced in a process of reacting a substance containing a halogen and silicon or reacting a substance containing silicon and a substance containing a halogen. The treatment of the side-product includes bringing the side-product into contact with a treat- (Continued)

ment fluid containing water to obtain a first solid matter. The determination method includes determining the progress of the treatment of the side-product based on a signal according to a chemical analysis of at least one of an Si-α bond (α is at least one selected from the group consisting of F, Cl, Br, and I) and an Si—H bond, of the first solid matter.

11 Claims, 7 Drawing Sheets

(51) Int. Cl.
  *G01N 21/65* (2006.01)
  *G01N 24/08* (2006.01)
  *C30B 25/02* (2006.01)
(52) U.S. Cl.
  CPC ............ *G01N 24/088* (2013.01); *C30B 25/02* (2013.01); *G01N 2201/06113* (2013.01)
(58) Field of Classification Search
  CPC .......... G01N 2021/8411; C01B 33/107; C30B 25/02; C30B 25/14; C30B 33/00; C23C 16/44; C23C 16/4412; G01R 33/46; H01L 21/31; H01L 21/67017
  See application file for complete search history.

(56) References Cited

U.S. PATENT DOCUMENTS

| 2013/0252434 | A1* | 9/2013 | Yuasa | H01L 21/0228 118/724 |
|---|---|---|---|---|
| 2013/0263774 | A1 | 10/2013 | Torimi et al. | |
| 2017/0067152 | A1 | 3/2017 | Hayashi | |
| 2021/0002760 | A1 | 1/2021 | Uchida et al. | |

FOREIGN PATENT DOCUMENTS

| JP | 2005-216911 A | 8/2005 |
|---|---|---|
| JP | 2012-049342 A | 3/2012 |
| JP | 2013-197474 A | 9/2013 |
| JP | 2016-013965 A | 1/2016 |
| JP | 2017-054862 A | 3/2017 |
| JP | WO2019/181044 A1 | 9/2019 |
| KR | 10-2014-0004108 A | 1/2014 |

OTHER PUBLICATIONS

Mitsubishi, Mitsubishi Materials Corporation Yokkaichi Plant High-purity polycrystalline silicon manufacturing facility Explosion and fire accident investigation report, 2014 (Year: 2014).*
Ignatyev, Vibrational spectra of trimethylsilanol The problem of the assignment of the SiOH group frequencies, Spectrochimica Acta Part A 60 (2004) 1169-1178 (Year: 2004).*
International Search Report issued Mar. 24, 2020 in PCT/JP2020/001104 filed on Jan. 15, 2020, 1 page.
Mitsubishi Materials Corporation Yokkaichi Plant Explosion & Fire Accident Investigation Committee, "Investigative Report by the accident investigation committee for the explosion & fire accident occurred in high-purity polycrystalline silicon manufacturing facility at Yokkaichi plant of Mitsubishi Materials Corporation", Jun. 12, 2014, 26 pages (with English Machine Translation).
Meyer-Wegner et al., "The Perchlorinated Silanes $Si_2Cl_6$ and $Si_3Cl_8$ as Sources of $SiCl_2$", Chemistry A European Journal, vol. 17, issue 17, Apr. 18, 2011, pp. 4715-4719.
German Oficial Action Issued Apr. 5, 2024 in German Application No. 11 2020 000 500.3 with English translation, therein, 11 pgs.
Investigative report by the accident investigation committee for the explosion & fire accident occurred in the high-purity polycrystalline silicon manufacturing facility at Yokkaichi Plant of Mitsubishi Materials Corporation), non-official translation (Mitsubishi Materiais Corporation Yokkalchi Plant Explosion and Fire Accident Investigation Committee, 174 pgs. URL: https://www.mmc.co.jp/corporate/ie/news/press/2014/pdf/14-0612a.pdf.
Korean Decision to Grant a Patent issued Sep. 11, 2024 in Korean Application 10-2024-7019961, (with unedited computer-generated English translation), 10 pages.

* cited by examiner

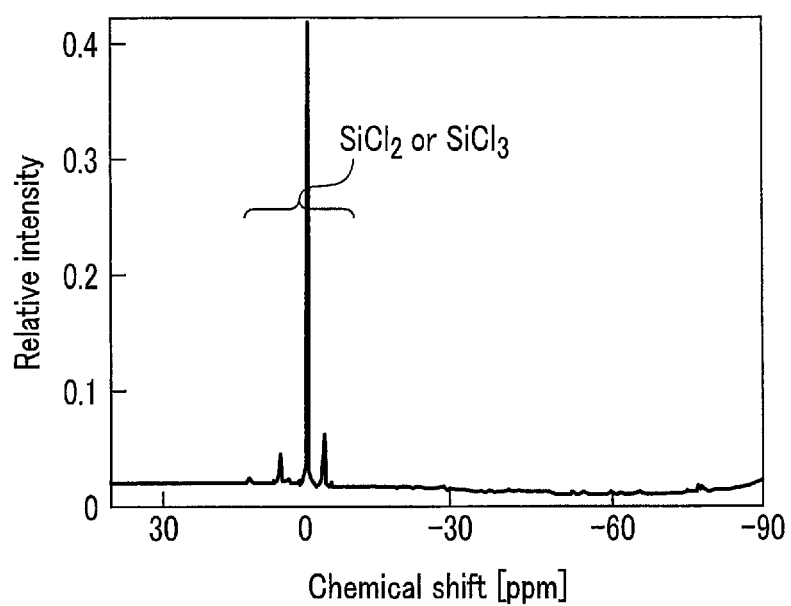
F I G. 1

DETERMINATION METHOD AND TREATMENT METHOD

CROSS-REFERENCE TO RELATED APPLICATIONS

This application is a Continuation Application of PCT Application No. PCT/JP2020/001104, filed Jan. 15, 2020 and based upon and claiming the benefit of priority from prior Japanese Patent Application No. 2019-011524, filed Jan. 25, 2019, the entire contents of all of which are incorporated herein by reference.

FIELD

Embodiments described herein relate generally to a determination method and a treatment method.

BACKGROUND

Semiconductor silicon substrates are widely used as materials for forming various electronic circuits. A film containing a silicon-containing substance may be formed over the semiconductor silicon substrate in order to facilitate formation of an electronic circuit. An epitaxial growing apparatus is known as an example of an apparatus for forming such a film.

The epitaxial growing apparatus includes a reaction chamber, a supply pipe attached to the reaction chamber with which raw material gas is supplied, and an exhaust pipe attached to the reaction chamber with which exhaust gas is exhausted. In the epitaxial growing apparatus, a substrate is placed in the reaction chamber under reduced pressure in an inert atmosphere, and the raw material gas introduced into the reaction chamber is reacted with the heated substrate, so that a film containing a silicon-containing substance is formed over the substrate. As the raw material gas, for example, a hydrogen gas containing a compound containing chlorine and silicon is used. The raw material gas introduced into the reaction chamber is exhausted as an exhaust gas to the outside of the apparatus through the exhaust pipe. The exhaust gas may contain a compound containing chlorine and silicon, etc.

Here, the temperature in the reaction chamber is much higher than that in the exhaust pipe. Therefore, the compound containing silicon and chlorine contained in the exhaust gas exhausted into the exhaust pipe becomes cooled in the exhaust pipe and may precipitate as a side-product. The side-product is also called an oily silane, and may be a highly viscous liquid substance or a solid. There is demand for making such a side-product unhazardous by a highly safe method.

BRIEF DESCRIPTION OF THE DRAWINGS

FIG. 1 is a graph showing an example of a $^{29}$Si NMR spectrum of a side-product;

DETAILED DESCRIPTION

Figure 2:
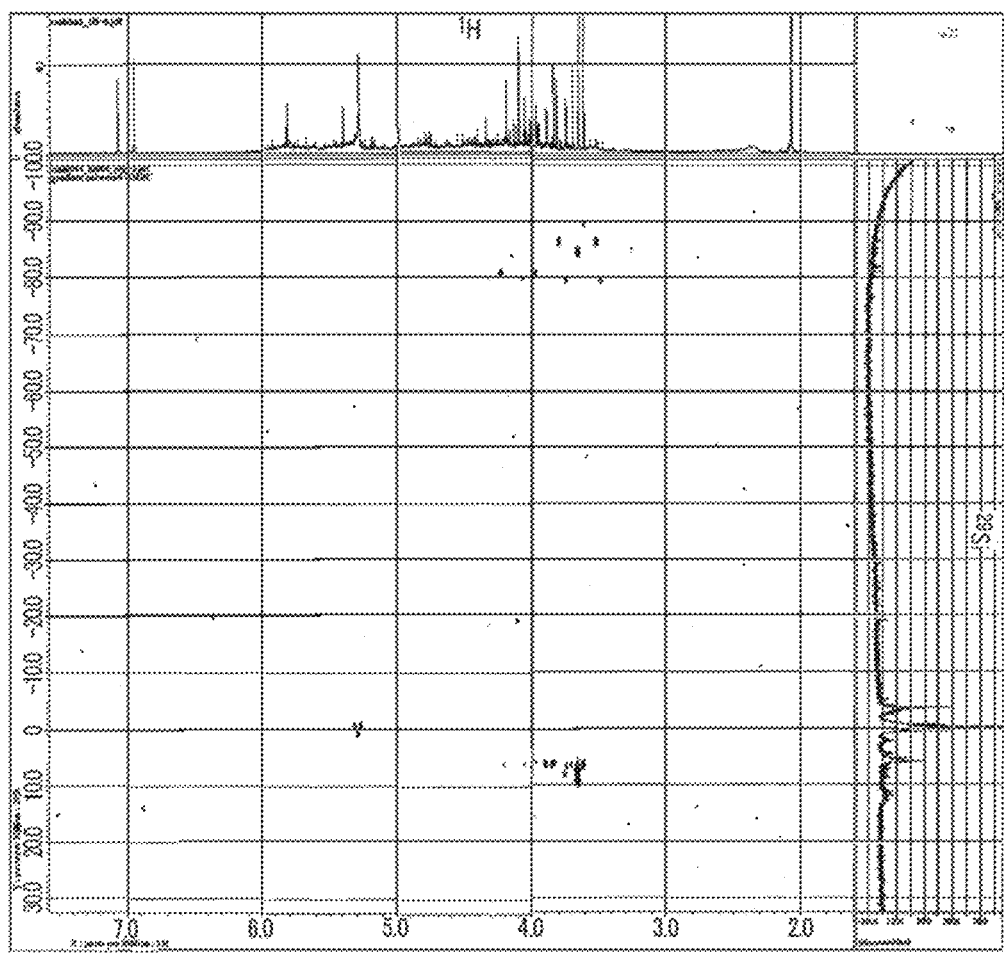
FIG. 2 is a graph showing an example of an H—Si shift correlated two dimensional NMR spectrum of a side-product.

According to one embodiment, a determination method is provided. The determination method determines progress of a treatment of a side-product produced in a process of reacting a substance containing a halogen and silicon or reacting a substance containing silicon and a substance containing a halogen. The treatment of the side-product includes bringing the side-product into contact with a treatment fluid containing water to obtain a first solid matter. The determination method includes determining the progress of the treatment of the side-product based on a signal according to a chemical analysis of at least one of an Si-α bond (α is at least one selected from the group consisting of F, Cl, Br, and I) and an Si—H bond, of the first solid matter.

According to another embodiment, a treatment method is provided. The treatment method is a method for treating a side-product produced in a process of reacting a substance containing a halogen and silicon or reacting a substance containing silicon and a substance containing a halogen. The treatment method includes bringing the side-product into contact with a treatment fluid containing water to obtain a first solid matter; and determining progress of a treatment of the side-product based on a signal according to a chemical analysis of at least one of an Si-α bond (α is at least one selected from the group consisting of F, Cl, Br, and I) and an Si—H bond, of the first solid matter.

Alternatively, the treatment method includes bringing the side-product into contact with water to obtain a second solid matter; bringing the second solid matter into contact with a basic aqueous solution to obtain a third solid matter; and determining progress of a treatment of the side-product based on a signal according to a chemical analysis of at least one of an Si-α bond (α is at least one selected from the group consisting of F, Cl, Br, and I) and an Si—H bond, of the third solid matter.

[Determination Method]

As a method of treating a side-product produced by a method of depositing a silicon-containing substance on a substrate using a gas containing silicon and a halogen, a method of bringing the side-product into contact with water to hydrolyze the side-product has been proposed. The present inventors have also proposed a method for performing a neutralizing decomposition of a side-product by bringing the side-product into contact with a basic aqueous solution.

However, in such a method for treating a side-product, there has not been established a method for determining a degree of progress of treatment of the side-product, that is, determining whether or not the neutralizing decomposition of the side-product has completed or whether or not the hydrolysis of the side-product has completed. If a method for determining the degree of progress of these treatments is established, the treatment of the side-product can be performed more safely and more efficiently.

As a result of diligent research, the present inventors have found that the side-product contains at least one of an Si-α bond and a Si—H bond. Here, α is at least one element selected from the group consisting of F, Cl, Br, and I. The inventors have also gained insight that these bonds decrease with the progress of neutralizing decomposition or hydrolysis of the side-product.

The determination method according to an embodiment based on such insight includes determining the progress of treatment of the side-product based on a signal according to a chemical analysis of at least one of the Si-α bond and the Si—H bond of a first solid matter.

In other words, it is considered that the intensity of the signal derived from the Si-α bond or the Si—H bond obtained by performing the chemical analysis on the side-product correlates with the amount of the Si-α bonds or the Si—H bonds contained in the side-product. Therefore, the degree of progress of the neutralizing decomposition or hydrolysis treatment of the side-product can be determined by examining the intensity of the signal. Hereinafter, details of the determination method according to the embodiment will be described.

1) Side-Product

The side-product is, for example, in solid, liquid, pasty or creamy form. The side-product may react with water or oxygen to produce substances having explosivity and inflammability. The side-product is considered to be a compound containing at least one of an Si-α bond and an Si—H bond. Inclusion of an Si—H bond or an Si-α bond in the side-product can be examined by chemical analysis such as Raman spectroscopic analysis, infrared spectroscopic analysis, nuclear magnetic resonance (NMR) spectroscopic analysis, or X-ray analysis. When performing analysis with respect of the side-product, the side-product extracted under an inert atmosphere is prepared into a measurement sample under an inert atmosphere, so that oxygen or water does not come into contact therewith, and used.

As a specific example showing that the side-product includes an Si—Cl bond which is a kind of an Si-α bond and an Si—H bond, the nuclear magnetic resonance spectroscopic analysis will be described as an example.

FIG. 1 is a graph showing an example of a $^{29}$Si NMR spectrum of a side-product. In FIG. 1, the horizontal axis represents a chemical shift (ppm) and the vertical axis represents a relative intensity. In the $^{29}$Si NMR spectrum shown in FIG. 1, a signal having the largest relative intensity is detected at the position of −0.4 ppm. The signal appearing at the position of −0.4 ppm is presumed to belong to the $SiCl_3$ unit or the $SiCl_2$ unit from the data disclosed in non-patent literature Frank Meyer-Wegner, Andor Nadj, Michael Bolte, Norbert Auner, Matthias Wagner, Max C. Holthausen, and Hans-Wolfram W. Lerner, "The Perchlorinated Silanes $Si_2Cl_6$ and $Si_3Cl_8$ as Sources of $SiCl_2$" Chemistry A European Journal, Apr. 18, 2011, Volume 17, Issue 17, p. 4715-4719. Therefore, it can be determined from FIG. 1 that the side-product has an Si—Cl bond.

FIG. 2 is a graph showing an example of an H—Si shift correlated two dimensional NMR spectrum of a side-product. In FIG. 2, the horizontal axis represents a chemical shift (ppm) of $^1$H, and the vertical axis represents a chemical shift (ppm) of $^{29}$Si. The spectrum shown in FIG. 2 shows a plurality of cross-peaks. The cross-peaks indicate the correlation between directly bound $^1$H and $^{29}$Si. Therefore, it can be determined from FIG. 2 that the side-product has an Si—H bond.

In the nuclear magnetic resonance spectroscopic analysis, for example, 0.2 g of the side-product and 2 mL of dehydrogenated heavy toluene (product number 21744-1A, manufactured by Kanto Chemical Co., Inc.) are mixed, and the mixture left to stand for 4 hours is used as a measurement sample. This measurement sample is dispensed into a sample tube with a J.YOUNG valve (S-5-600-JY-8) manufactured by HARUNA Inc., and this NMR sample tube is set in a NMR spectroscopic analyzer to measure a $^{29}$Si NMR spectrum and an H—Si shift correlated two dimensional NMR spectrum. As the NMR spectroscopic analyzer, for example, JNM-ECA800 manufactured by JEOL Ltd. can be used. In the measurement of the $^{29}$Si NMR spectrum, for example, the cumulative number of times is set to 3500, and the measurement range is set to −500 ppm or more and 500 ppm or less. In the measurement of the H—Si shift correlated two dimensional NMR spectrum, the cumulative number of times is set to 8192, the measurement range of $^1$H nuclei is set to 0.75 ppm or more and 8.25 ppm or less, and the measurement range of $^{29}$Si nuclei is set to −100 ppm or more and 32.5 ppm or less.

The side-product may be halosilanes containing silicon and halogen element(s). The halosilanes may contain an Si—Si bond and at least one selected from the group consisting of an Si—Cl bond, an Si—F bond, an Si—Br bond, and an Si—I bond. In particular, the side-product may be chlorosilanes containing silicon and chlorine. The side-product may include halosilanes having a ring structure. Whether the side-product includes halosilanes having a ring structure can be presumed by analyzing the side-product using a nuclear magnetic resonance spectroscopic analysis, mass spectrometry (MS) analysis, or the like. For example, when the $^{29}$Si NMR spectrum and the mass spectrum obtained for the side-product satisfy the following conditions (1) and (2), the side-product can be presumed to be chlorosilane(s) having a ring structure.

Condition (1): In the $^{29}$Si NMR spectrum obtained for the side-product, a signal having the highest relative intensity appears at the position of −0.4 ppm.

Condition (2): In the mass spectrum obtained for the side-product, a signal assigned to $(SiCl_2)_n$ is detected in a range of mass-to-charge ratios from 0 m/z to about 1500 m/z.

Halosilanes having a ring structure are considered to be represented by any one of structural formulae (e) to (h) shown below. In the structural formulae (e) to (h), X is at least one element selected from the group consisting of F, Cl, Br and I.

[Chemical Formula 1]

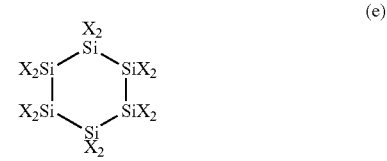

X = F, Cl, Br, I

[Chemical Formula 2]

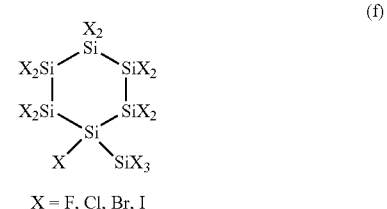

X = F, Cl, Br, I

[Chemical Formula 3]

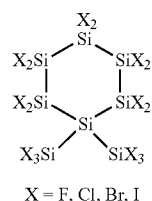

(g)

X = F, Cl, Br, I

[Chemical Formula 4]

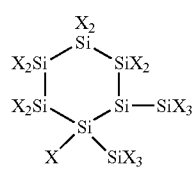

(h)

X = F, Cl, Br, I

The halosilanes having a ring structure may have a 4-membered ring structure, a 5-membered ring structure, a 6-membered ring structure other than structural formulae (e) to (h), a 7-membered ring structure, an 8-membered ring structure, or a multi-membered ring structure, as represented by structural formulae (1) to (21) below. In the following structural formulae (1) to (21), X represents at least one element selected from the group consisting of F, Cl, Br, and I. Note that the following structural formulae (1-1) to (21-1) represent chlorosilanes in which the element X in the structural formulae (1) to (21) is chlorine.

[Chemical Formula 5]

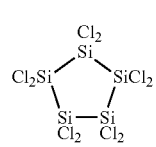

(1-1)

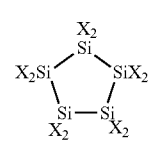

(1)

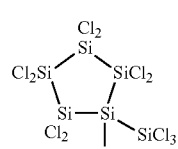

(2-1)

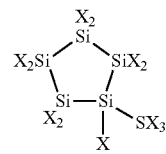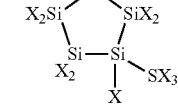

(2)

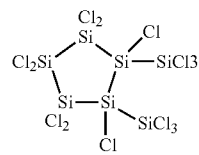

(3-1)

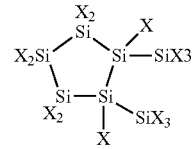

(3)

[Chemical Formula 6]

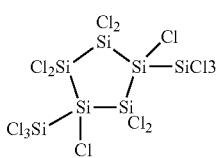

(4-1)

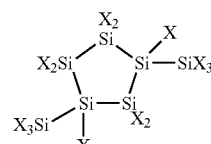

(4)

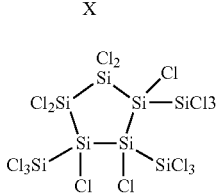

(5-1)

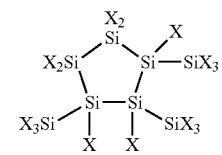

(5)

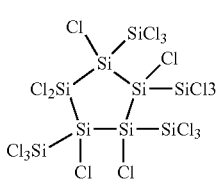

(6-1)

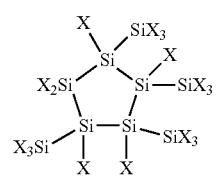

(6)

[Chemical Formula 7]

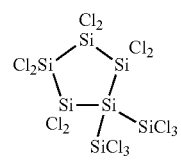

(7-1)

-continued
(7) 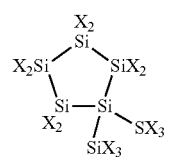
(8-1) 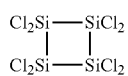
(8) 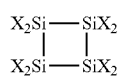
(9-1) 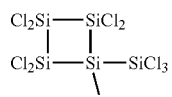
(9) 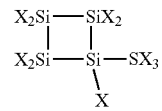
(10-1) 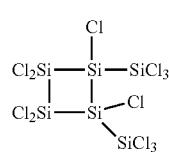
(10) 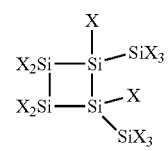
(11-1) 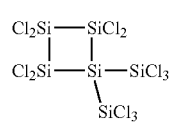
(11) 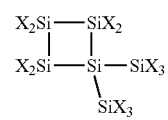
[Chemical Formula 8]
(12-1) 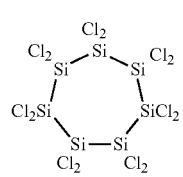
(12) 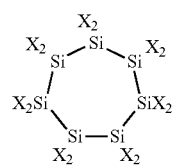
-continued
(13-1) 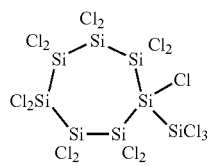
(13) 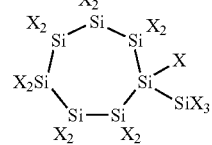
(14-1) 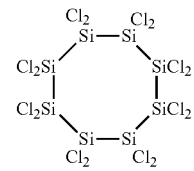
(14) 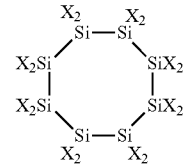
(15-1) 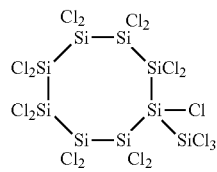
(15) 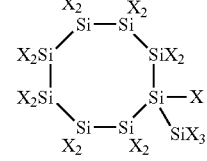
[Chemical Formula 9]
(16-1) 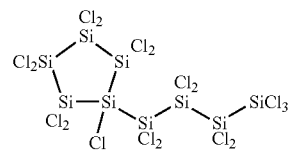
(16) 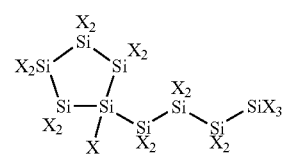
(17-1) 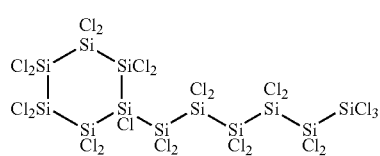

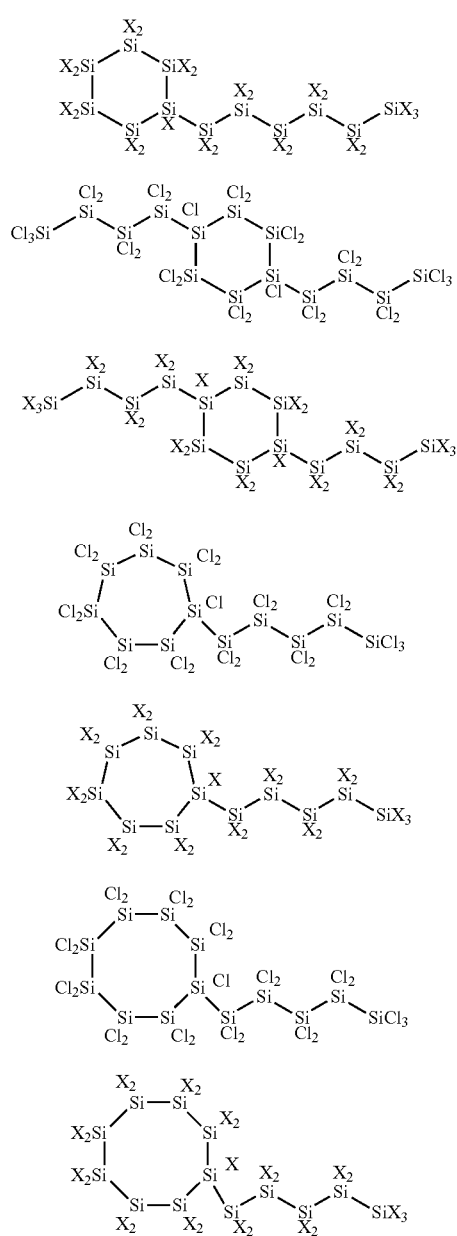

[Chemical Formula 10]

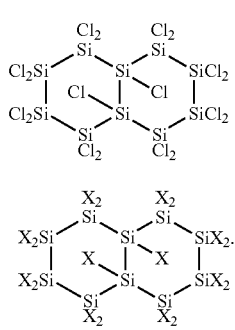

The halosilanes having a ring structure in the side-product may be a homocyclic compound having a silicon ring consisting of only silicon, as shown in the above structural formulae (1) to (21). In addition, as shown in the structural formulae (1) to (21), the halosilanes may be an inorganic cyclic compound containing no carbon. The side-product may include a heterocyclic compound consisting of silicon and oxygen.

Halosilanes having a chained structure that may be included in the side-product are represented by, for example, the following structural formulae (22) and (23). In the following structural formula (22), N is, for example, a positive integer of 0 or more and 15 or less. In the following structural formulae (22) and (23), X is at least one element selected from the group consisting of F, Cl, Br and I. The following structural formulae (22-1) and (23-1) represent chlorosilanes in which the element X in the structural formulae (22) and (23) is chlorine.

[Chemical Formula 11]

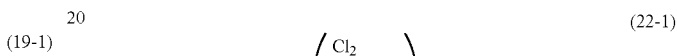

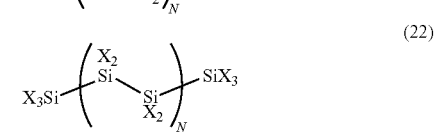

N = Positive Integer

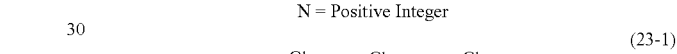

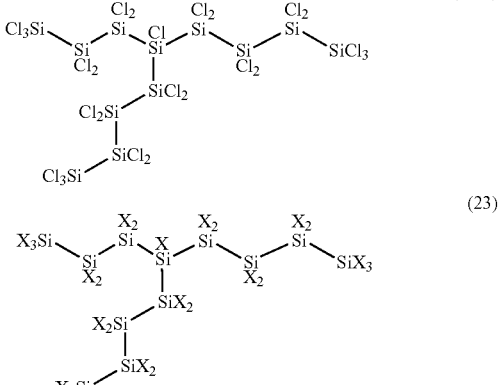

The halosilanes having a chained structure may be straight-chain compounds having no branch as shown in the structural formula (22). The halosilanes having a chained structure may be a branched chain compound represented by the structural formula (23). It is possible to presume by mass spectrometry, whether the side-product contains halosilanes having a chained structure.

The side-product produced by the method of depositing a silicon-containing substance on a substrate using a gas containing silicon and a halogen may include, as halosilanes, only those having a ring structure, only those having a chained structure, or both of those having a ring structure and those having a chained structure.

The side-product may be produced by the method of depositing a silicon-containing substance on a substrate using a gas containing silicon and a halogen. Examples of such a method include a chemical vapor deposition (CVD) method such as an epitaxial growth method.

The formation of the side-product will be described in detail by taking the epitaxial growth method as an example.

Figure 3:
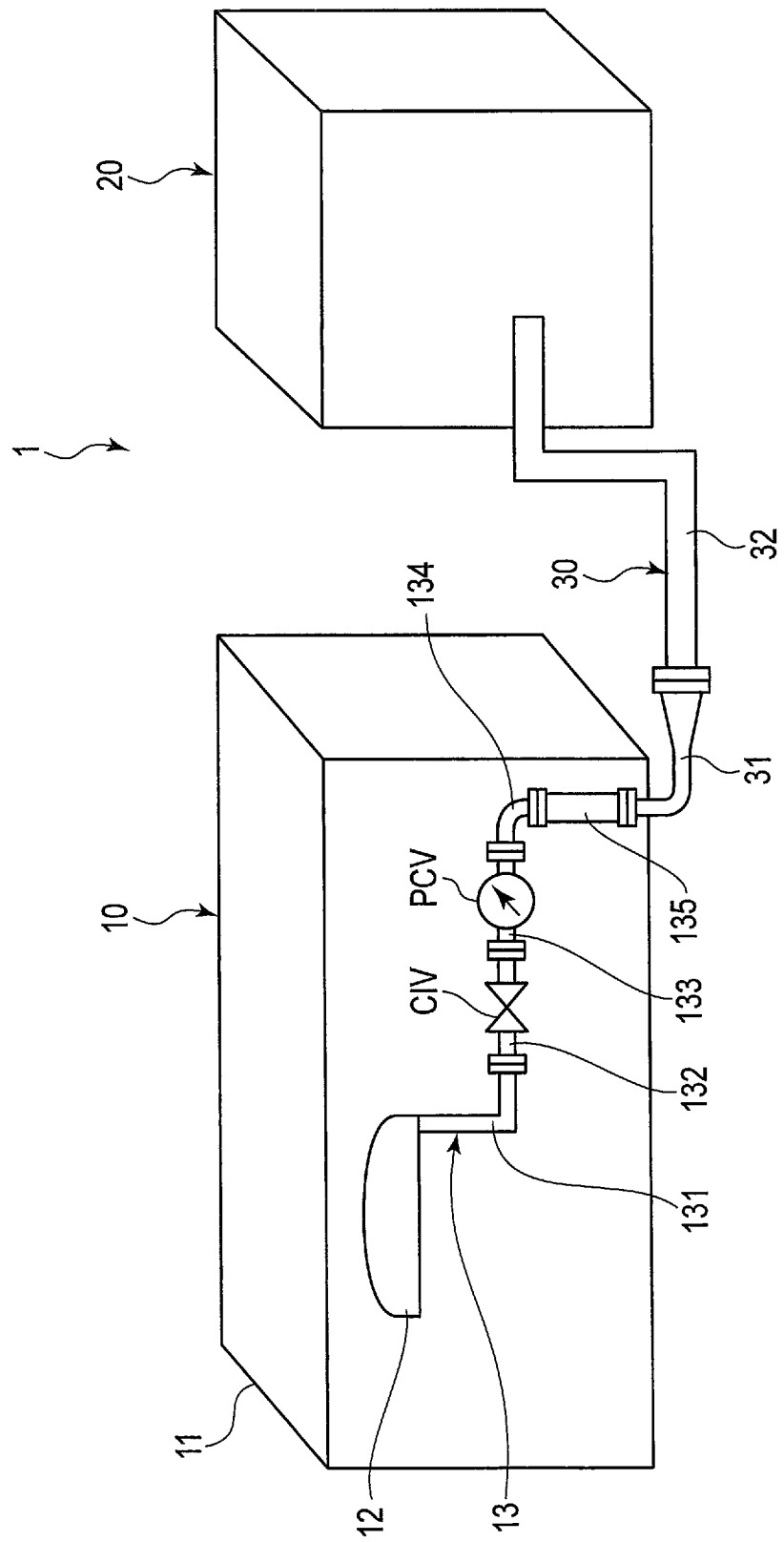
FIG. 3 is a perspective view schematically showing an example of an epitaxial growing apparatus.

FIG. 3 is a perspective view schematically showing an example of an epitaxial growing apparatus. The epitaxial growing apparatus 1 shown in FIG. 3 includes an apparatus main body 10, an abatement apparatus 20, and a connecting portion 30.

The apparatus main body 10 includes a housing 11, a reaction chamber 12, an exhaust pipe 13, and a supply pipe (not shown). The reaction chamber 12, the exhaust pipe 13, and the supply pipe are housed in the housing 11. One end of the supply pipe is attached to the reaction chamber 12. The other end of the supply pipe is attached to a raw material gas supply device (not shown).

One end of the exhaust pipe 13 is attached to the reaction chamber 12. The other end of the exhaust pipe 13 is attached to the connecting portion 30. The exhaust pipe 13 includes pipes 131 to 135. One end of the pipe 131 is attached to the reaction chamber 12. The other end of the pipe 131 is attached to one end of the pipe 132. The pipe 132 includes a chamber isolation valve (CIV). The other end of the pipe 132 is coupled to one end of the pipe 133. The pipe 133 includes a pressure control valve (PCV). The other end of the pipe 133 is coupled to one end of the pipe 134. The other end of the pipe 134 is coupled to one end of the pipe 135. The other end of the pipe 135 is coupled to one end of a pipe 31, which will be described later, of the connecting portion 30.

The connecting portion 30 includes the pipe 31 and a pipe 32. One end of the pipe 31 is coupled to the other end of the pipe 135. The other end of the pipe 31 is coupled to one end of the pipe 32. The other end of the pipe 32 is coupled to the abatement apparatus 20.

In the epitaxial growing apparatus 1, the raw material gas is exhausted from a supply device for the raw material gas and introduced into the reaction chamber 12 through the supply pipe. The raw material gas is a gas containing silicon and a halogen element (s). Therefore, the raw material gas contains one or more halogen elements, and silicon. The gas containing silicon and a halogen element (s) is, for example, a mixed gas of hydrogen and a compound containing silicon and a halogen element (s). The concentration of hydrogen in the mixed gas is, for example, 95% by volume or more. The compound containing silicon and a halogen element(s) includes one or more compounds selected from the group consisting of a compound containing silicon and chlorine, a compound containing silicon and bromine, a compound containing silicon and fluorine, and a compound containing silicon and iodine. The compound containing silicon and a halogen(s) includes halosilanes.

The compound containing silicon and chlorine is, for example, any one of chlorosilanes such as dichlorosilane ($SiH_2Cl_2$), trichlorosilane ($SiHCl_3$), and tetrachlorosilane ($SiCl_4$), or a mixture thereof. If the compound containing silicon and chlorine is contained in the mixed gas, the mixed gas may contain at least one of monosilane ($SiH_4$) and hydrochloric acid (HCl). The compound containing silicon and bromine is, for example, any one of bromosilanes such as dibromosilane ($SiH_2Br_2$), tribromosilane ($SiHBr_3$), and tetrabromosilane ($SiBr_4$), or a mixture thereof. If the compound containing silicon and bromine is contained in the mixed gas, the mixed gas may contain at least one of monosilane ($SiH_4$) and hydrogen bromide (HBr).

The raw material gas may contain two or more kinds of halogen elements, and the raw material gas may contain one or more kinds of halogen elements other than chlorine in addition to chlorine. In one example, the raw material gas is a mixed gas of hydrogen gas, a compound containing silicon and chlorine, and at least one of a compound containing a halogen element other than chlorine and a halogen gas other than chlorine gas. The compound containing a halogen element other than chlorine may contain silicon or may not contain silicon. In another example, the raw material gas is a mixed gas of hydrogen gas, a compound containing a halogen element other than chlorine and silicon, and at least one of a compound containing chlorine and chlorine gas. The compound containing chlorine may contain silicon or may not contain silicon.

In the reaction chamber 12, a substrate is placed under reduced pressure, and the substrate is heated to a temperature equal to or higher than a reaction temperature with the raw material gas. The reaction temperature may be 600° C. or higher according to one example, and 1000° C. or higher according to another example. When the substrate and the material gas react with each other, a single crystalline or polycrystalline silicon-containing film is formed on the substrate by a thermochemical reaction. The substrate is, for example, a single-crystal silicon substrate.

The exhaust gas exhausted from the reaction chamber 12 is introduced into the abatement apparatus 20 through an exhaust path consisting of the exhaust pipe 13 and the connecting portion 30. The exhaust gas may contain, among compounds containing silicon and the halogen contained in the raw material gas, those that had not deposited on the substrate, monosilane, hydrogen chloride, and the like. The exhaust gas is combusted and made unhazardous in the abatement apparatus 20.

The side-product may become precipitated in parts of the exhaust pipe 13 and the connecting portion 30. The side-product is considered to be a solid or liquid matter obtained by polymerization of the components contained in the exhaust gas described above. Within the exhaust pipe 13, the side-product is likely to be precipitated near the pipe 134. In the pipes 131 to 133 located near the reaction chamber 12, the temperature of the exhaust gas is sufficiently high; therefore, it is considered that the polymer hardly becomes precipitated. In addition, in the connecting portion located far from the reaction chamber 12, the amount of components of the side-product in the exhaust gas is little; therefore, it is considered that the side-product is hardly produced.

The apparatus, in which the side-product containing halosilanes and the like becomes generated in the exhaust path, is not limited to the epitaxial growing apparatus. In one example of a silicon-containing material forming apparatus, a raw material containing silicon and a raw material containing a halogen are supplied to a reaction chamber by different routes. Here, the raw material containing silicon may include powdery (solid) silicon. The raw material containing a halogen may be a raw material gas containing a hydrogen halide, such as hydrogen chloride.

In the silicon-containing material forming apparatus of this example, a substrate such as a silicon substrate is not provided in the reaction chamber. In the reaction chamber, the raw material containing silicon and the raw material containing a halogen element, which are separately introduced into the reaction chamber, react with each other. Halosilanes and hydrogen are produced by the reaction between the raw material containing silicon and the raw material containing a halogen element. Then, a silicon-containing material is obtained by a reaction between the halosilanes and hydrogen. The halosilanes produced by the reaction of the raw material containing silicon and the raw material containing a halogen element may include chlorosilanes such as trichlorosilane ($SiHCl_3$). In the reaction in the reaction chamber, hydrogen halide, silicon tetrahalide, and the like may be produced.

Also in the silicon-containing material forming apparatus of the present example, the exhaust gas (exhaust substance) exhausted from the reaction chamber contains halosilanes, and the halosilanes contained in the exhaust gas may contain chlorosilanes such as trichlorosilane mentioned above. In addition, the exhaust gas from the reaction chamber may contain hydrogen, and also contain hydrogen halide and silicon tetrahalide produced by the reaction in the reaction chamber, as well. The hydrogen halide produced in the reaction in the reaction chamber may include hydrogen chloride (HCl). The silicon tetrahalide produced by the reaction in the reaction chamber may include silicon tetrachloride ($SiCl_4$).

In the silicon-containing material forming apparatus of the present example, a cooling mechanism for cooling the exhaust gas is provided in the exhaust path of the exhaust gas (exhaust substance) from the reaction chamber. The exhaust gas is liquefied by being cooled by the cooling mechanism. Then, the liquid substance (exhaust substance) obtained by liquefying the exhaust gas is collected.

In the silicon-containing material forming apparatus of the present example, as well, the side-product may become precipitated in the exhaust path, due to liquefaction of the exhaust gas by the cooling mechanism. The side-product may contain a part of the liquid substance of the exhaust gas that remains in the exhaust path without being collected. The side-product contains halosilanes contained in the exhaust gas and may also contain a hydrolysis product of the halosilanes, as well. The hydrolysis product of halosilanes may be a solid material. The side-product may contain silicon tetrahalide or the like contained in the exhaust gas. In addition, in the exhaust path, the side-product is apt to be precipitated, particularly in the cooling mechanism and the vicinity thereof.

As described above, in the silicon-containing material forming apparatus of the present example, as well, the side-product containing halosilanes and the like may become precipitated in the exhaust path. The side-product generated in the silicon-containing material forming apparatus of this example may also become transformed into a material having explosivity in an air atmosphere. Therefore, in the silicon-containing material forming apparatus of the present example, as well, the side-product is made unhazardous by using the treatment fluid in the exhaust path in the same manner as in any of the above-described embodiments and the like.

2) Treatment Method for Side-Product

A treatment method for the side-product includes bringing the side-product into contact with a treatment fluid containing water to obtain a first solid matter. The treatment fluid includes water.

When the side-product is brought into contact with water, hydrolysis of the side-product may occur. By the hydrolysis, a solid hydrolysis product may be formed, along with hydrogen gas, and a hydrogen halide such as hydrogen chloride (HCl).

When the side-product is brought into contact with a basic treatment fluid, neutralizing decomposition of the side-product may occur. By the neutralizing decomposition, a solid neutralized decomposition product may be formed, along with hydrogen gas or the like. In the neutralizing decomposition of the side-product, hydrogen halides such as hydrogen chloride generated by the hydrolysis of the side-product may be neutralized by reacting with hydroxide ions in the treatment fluid.

As the first solid matter, a hydrolysis product or a neutralized decomposition product of the side-product can be used. The first solid matter may be in bulk form or may be dispersed as fine particles in the treatment fluid.

The present inventors have found that the hydrolysis of a side-product with water cannot sufficiently make the side-product unhazardous. Thus, the hydrolysis product of the side-product may have explosivity and inflammability. This is supposedly due to remaining of Si—Si bonds, for the hydrolysis with water. It is presumed that not all the Si-α bonds and Si—H bonds of the side-product are reacted in the hydrolysis of the side-product. In addition, in the case of using a neutral aqueous solution, since the formed hydrogen halides such as hydrogen chloride cannot be neutralized, the pH of the treatment fluid after the reaction treatment becomes very low, whereby the treatment fluid may have corrosiveness. From the above, when a neutral or acidic aqueous solution is used, it is more difficult to make the side-product unhazardous in a highly safe state as compared with the method using a basic aqueous solution. The hydrolysis of the side-product with water is not sufficient for completion of the treatment for making the side-product unhazardous, and it can be said that part of the treatment is not complete.

In contrast, when neutralizing decomposition of the side-product is performed using a basic aqueous solution, the side-product can be sufficiently made unhazardous. Thus, the neutralized decomposition product of the side-product has neither explosivity nor inflammability. This is supposedly due to neutralizing decomposition spanning even to the Si—Si bonds of the halosilanes present inside the side-product, when the side-product is reacted with the basic aqueous solution. In addition, with the neutralizing decomposition of the side-product, the Si-α bonds and the Si—H bonds of the side-product can be sufficiently broken.

The hydrolysis product may contain a compound having at least one of a siloxane bond (Si—O—Si, O—Si—O) and a silanol group (—Si—OH). The hydrolysis product may contain a hydrosilanol group (—Si(H)OH), as well. It is possible to presume whether the hydrolysis product has at least one of a siloxane bond and a silanol group, by the nuclear magnetic resonance spectroscopic analysis described below.

First, the side-product is extracted in the same method as described above. In a draft chamber under an air atmosphere, pure water is added into a petri dish containing the side-product, to obtain a mixture of the side-product and the pure water. The amount of pure water is, for example, 1 mL with respect to 50 mg of the side-product. Pure water indicates water having a specific resistance of 18.2 MΩ·cm or more. The mixture is stirred with a spatula made of fluorine resin or the like, then the petri dish is covered with a lid, and the mixture is left to stand for 1 hour or more. Thereafter, the lid of the petri dish is removed, and the mixture is left to stand at room temperature for 24 hours or more to evaporate water from the mixture. The solid matter thus obtained is pulverized with a spatula made of fluorine resin or the like to obtain a powder. The powder is dried for 2 hours or more under reduced pressure of 5 Pa or less by a vacuum pump to obtain a measurement sample.

Next, the measurement sample is dispensed into a 3.2 mm zirconia sample tube (708239971) manufactured by JEOL Ltd. The NMR sample tube is set in a NMR spectroscopic analyzer, and a $^{29}Si$ NMR spectrum is measured. As the NMR spectroscopic analyzer, for example, JNM-ECA800 manufactured by JEOL Ltd. can be used. In the measurement of the $^{29}Si$ NMR spectrum, for example, the cumulative number of times is set to 4096, and the measurement range is set to −250 ppm or more and 250 ppm or less.

In the $^{29}$Si NMR spectrum of the hydrolysis product thus obtained, a peak appearing in the range of −120 ppm or more and 10 ppm or less is considered to be derived from at least one of a siloxane bond and a silanol group. Therefore, when the hydrolysis product has a peak within this range, it can be presumed that the hydrolysis product has at least one of a siloxane bond and a silanol group.

Figure 4:
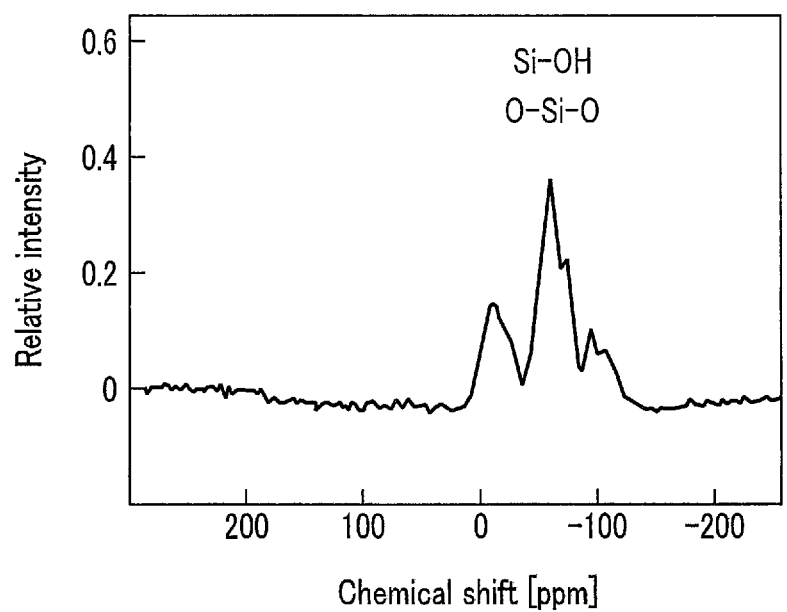
FIG. 4 is a graph showing an example of a $^{29}$Si NMR spectrum of a hydrolysis product of a side-product.

FIG. 4 is a graph showing an example of a $^{29}$Si NMR spectrum of a hydrolysis product of a side-product. In FIG. 4, the horizontal axis represents a chemical shift (ppm) and the vertical axis represents a relative intensity. In the $^{29}$Si NMR spectrum shown in FIG. 4, a peak having the largest relative intensity is detected at the position of −70 ppm.

The water used as the treatment fluid may be pure water, ion-exchanged water, purified water, tap water, or a mixture thereof.

As the basic treatment fluid, one obtained by dissolving at least one of an inorganic base and an organic base in water may be used. In the basic treatment fluid, the concentration of the inorganic base and the organic base is, for example, 0.01% by mass or more and 30% by mass or less, and preferably 0.1% by mass or more and 10% by mass or less.

As the inorganic base, for example, at least one selected from the group consisting of a metal hydroxide such as a hydroxide of an alkali metal element and a hydroxide of an alkaline earth metal element, an alkali metal, a carbonate such as a carbonate of an alkali metal element and a carbonate of an alkaline earth metal element, a hydrogen carbonate such as a hydrogen carbonate of an alkali metal element, a metal oxide, and ammonium hydroxide ($NH_4OH$) is used.

The metal hydroxide is, for example, lithium hydroxide, sodium hydroxide, potassium hydroxide, rubidium hydroxide, cesium hydroxide, calcium hydroxide, magnesium hydroxide, copper hydroxide, iron hydroxide, zinc hydroxide, aluminum hydroxide, or a mixture thereof.

The alkali metal is, for example, a sole metal of potassium, a sole metal of lithium, a sole metal of sodium, or a mixture thereof.

The carbonate is, for example, sodium carbonate, potassium carbonate, ammonium carbonate, lithium carbonate, barium carbonate, magnesium carbonate, or a mixture thereof.

The hydrogen carbonate is, for example, sodium hydrogen carbonate, ammonium hydrogen carbonate, potassium hydrogen carbonate, calcium hydrogen carbonate, or a mixture thereof.

The metal oxide is, for example, calcium oxide, magnesium oxide, sodium oxide, or a mixture thereof.

The inorganic base is preferably at least one selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogen carbonate ($NaHCO_3$), and ammonium hydroxide ($NH_4OH$). Since such an inorganic base has low toxicity, the side-product can be treated more safely by using such an inorganic base.

The inorganic base is more preferably at least one selected from the group consisting of potassium hydroxide (KOH), sodium carbonate ($Na_2CO_3$), lithium hydroxide (LiOH), sodium hydrogen carbonate ($NaHCO_3$), and ammonium hydroxide ($NH_4OH$). When such an inorganic base is used, the reaction proceeds moderately, so that the treatment can be performed more safely.

As the organic base, for example, at least one selected from the group consisting of alkylammonium hydroxides, an organometallic compound, a metal alkoxide, an amine, and a heterocyclic amine is used.

The alkylammonium hydroxides are, for example, tetramethylammonium hydroxide, tetraethylammonium hydroxide, choline hydroxide, or a mixture thereof.

The organometallic compound is, for example, an organolithium, an organomagnesium, or a mixture thereof. The organolithium is, for example, butyllithium, methyllithium or a mixture thereof. The organomagnesium is, for example, butylmagnesium, methylmagnesium, or a mixture thereof.

The metal alkoxide is, for example, sodium ethoxide, sodium butoxide, potassium ethoxide, potassium butoxide, sodium phenoxide, lithium phenoxide, sodium ethoxide, sodium propoxide, sodium isopropoxide, or a mixture thereof.

The amine is methylamine, dimethylamine, trimethylamine, triethylamine, ethylenediamine, diethylamine, aniline, or a mixture thereof.

The heterocyclic amine is pyridine, pyrrolidine, imidazole, piperidine, or a mixture thereof.

The organic base is preferably at least one selected from the group consisting of sodium phenoxide ($C_6H_5ONa$), 2-hydroxyethyltrimethylammonium hydroxide (choline hydroxide), and tetramethylammonium hydroxide (TMAH).

The pH of the basic treatment fluid is preferably 8 or more and 14 or less before and after the treatment. The pH of the basic treatment fluid before treatment is more preferably 9 or more and 14 or less, and further preferably 10 or more and 14 or less.

The treatment fluid may contain optional components such as a surfactant and a pH buffer.

The surfactant increases the dispersibility of the side-product in the treatment fluid and improves the treatment rate. The concentration of the surfactant in the treatment fluid is, for example, 0.01% by mass or more and 10% by mass or less, and preferably 0.1% by mass or more and 1% by mass or less.

The surfactant contains, for example, at least one selected from the group consisting of an anionic surfactant, a cationic surfactant, an amphoteric surfactant, and a nonionic surfactant.

The anionic surfactant is, for example, sodium laurate, sodium stearate, sodium lauryl sulfate, sodium 1-hexanesulfonate, lauryl phosphate, or a mixture thereof.

The cationic surfactant is, for example, tetramethylammonium chloride, benzalkonium chloride, octyltrimethylammonium chloride, monomethylamine hydrochloride, butylpyridinium chloride, or a mixture thereof.

The amphoteric surfactant is, for example, lauryl dimethylaminoacetic acid betaine, cocamidepropyl betaine, sodium lauroyl glutamate, lauryl dimethylamine N-oxide, or a mixture thereof.

The nonionic surfactant is, for example, glycerin laurate, pentaethylene glycol monododecyl ether, polyoxyethylene sorbitan fatty ester, diethanolamide laurate, octylglucoside, cetanol, or a mixture thereof.

The surfactant preferably contains at least one of benzalkonium chloride and sodium laurate, and benzalkonium chloride is more preferably used.

The pH buffer serves to keep the pH of the treatment fluid constant during treatment of the side-product. By using the pH buffer, it is possible to prevent the pH of the solution after the side-product treatment from becoming excessively high or excessively low. Therefore, the side-product can be made unhazardous more safely by using the pH buffer.

The concentration of the pH buffer in the treatment fluid is, for example, 0.01% by mass or more and 30% by mass or less, and preferably 0.1% by mass or more and 10% by mass or less.

As the pH buffer, a mixture of a weak acid and its conjugate base or a mixture of a weak base and its conjugate acid can be used. For example, a mixture of acetic acid ($CH_3COOH$) and sodium acetate ($CH_3COONa$), a mixture of citric acid and sodium citrate, or a mixture of tris-hydroxy-methylamino-methane (THAM) and ethylenediamine tetra-acetic acid (EDTA) is used as the pH-buffer.

3) Determination Method

A determination method for the treatment of the side-product includes determining the progress of the treatment of the side-product, based on a signal according to a chemical analysis of at least one of the Si-α bond and the Si—H bond, of the first solid matter.

The Si-α bond contained in the side-product may become broken by reacting with water and a basic aqueous solution. In addition, the Si—H bond included in the side-product may become broken by reacting with the basic aqueous solution. Thus, the amount of Si-α bonds and Si—H bonds in the side-product may decrease as the treatment of the side-product progresses. Therefore, the degree of progress of the treatment of the side-product can be grasped using, as an index, a signal according to a chemical analysis of at least one of the Si-α bond and the Si—H bond of the first solid matter, which is the reaction product of the reaction of the side-product and the treatment fluid. This allows keeping track of the treatment of the side-product.

The determination method for the treatment of the side-product may include setting in advance a threshold value serving as a reference for determining whether the treatment of the side-product is completed. In this method, when the intensity of the signal of at least one of the Si-α bond and the Si—H bond of the first solid matter is equal to or less than the threshold value, it can be determined that the treatment of the side-product has completed, and when the intensity exceeds the threshold value, it can be determined that the treatment of the side-product has not completed.

Further, the determination method for the treatment of the side-product may include extracting the first solid matter at every predetermined time after the side-product is brought into contact with the treatment fluid, and obtaining the intensity of the signal of at least one of the Si-α bond and the Si—H bond in each extracted first solid matter. In this method, the intensity of the signal of at least one of the Si-α bond and the Si—H bond in the first solid matter that is in contact with the treatment fluid for a longer time is compared with the intensity of the signal of at least one of the Si-α bond and the Si—H bond in the first solid matter that is in contact with the treatment fluid for a shorter time, and the change with time is examined, whereby the progress of the treatment of the side-product can be grasped. Further, by combining this method with the above-described method of setting the threshold value, it is possible to determine whether or not the treatment of the side-product has completed or whether or not either of the neutralizing decomposition or the hydrolysis of the side-product has completed, at every elapsed time.

The signal derived from the Si-α bond or the Si—H bond contained in the first solid matter can be obtained by various chemical analyses. As the signals, for example, a height, an area, a full width at half maximum, or the like of a peak derived from the Si-α bond or the Si—H bond obtained by performing a chemical analysis on the first solid matter is used. These signals may be correlated with the content of the Si-α bonds or the Si—H bonds. Therefore, the content of the Si-α bonds and the Si—H bonds remaining in the first solid matter can be estimated using the peak derived from these bonds as an index.

The chemical analysis may be, for example, the Raman spectroscopic analysis, the infrared spectroscopic analysis, or the nuclear magnetic resonance spectroscopic analysis. The infrared spectroscopic analysis and the nuclear magnetic resonance spectroscopic analysis will be described below as examples of the method for obtaining a signal derived from the Si—Cl bond. Furthermore, the Raman spectroscopic analysis will be described as an example of the method for obtaining a signal derived from the Si—H bond.

3-1) Determination Method Using Infrared Spectroscopic Analysis

First, a first solid matter is extracted from a mixture of the first solid matter and the treatment fluid. The extracted first solid matter is pulverized using a spatula made of fluorine resin. The pulverized first solid matter is dried for 2 hours or more under reduced pressure of 5 Pa or less using a vacuum pump to obtain a measurement sample. As the measurement sample, at least a part of the first solid matter may be used, and the drying treatment may be omitted. In other words, the measurement sample may contain water or a basic aqueous solution.

Next, the infrared spectroscopic analysis is performed on the measurement sample by a single reflection ATR method to obtain an infrared spectrum. As the infrared spectroscopic analyzer, for example, FT/IR-6300 manufactured by JASCO Corporation is used. As the prism, for example, a diamond prism is used. In the analysis, for example, the incident angle is set to 45°, the measurement range is set to 400 $cm^{-1}$ or more and 4000 $cm^{-1}$ or less, the resolution is set to 4 $cm^{-1}$, and the cumulative number of times is set to 100. The obtained infrared spectrum is preferably subjected to baseline correction and smoothing treatment.

In the obtained infrared spectrum, the peak derived from the Si—Cl bonds is considered to appear in the range of the wavenumber of 800 $cm^{-1}$ or more and 900 $cm^{-1}$ or less. The absorbance I1 of the peak appearing in this range is considered to correlate with the amount of the Si—Cl bonds contained in the first solid matter. That is, if the absorbance I1 of this peak is high, it can be determined that the amount of the Si—Cl bonds contained in the first solid matter is large, and if the absorbance I1 is low, it can be determined that the amount of the Si—Cl bonds contained in the first solid matter is small. The peak intensity derived from the Si—Cl bonds can also be referred to as a local maximum value in the range of the wavenumber of 800 $cm^{-1}$ or more and 900 $cm^{-1}$ or less.

In addition, for example, the progress of the hydrolysis treatment or the neutralizing decomposition treatment can be kept track of by comparing the heights of the absorbance I1 of the local maximum value in the range of the wavenumber of 800 $cm^{-1}$ or more and 900 $cm^{-1}$ or less in the measurement samples that differ in elapsed time after mixing the side-product and the treatment fluid. First, in the same method as described above, an infrared spectrum of the first solid matter is obtained, and the absorbance I1-1 of the local maximum value is recorded. An infrared spectrum is then obtained for the first solid matter which has been in contact with the treatment fluid for a longer period of time and the absorbance I1-2 of the local maximum value is recorded. When the absorbance I1-2 is lower than the absorbance I1-1, it can be determined that the hydrolysis treatment or the neutralizing decomposition treatment has progressed. In addition, for example, when this operation is repeatedly performed at regular time intervals, at a point where the absorbance I1 of the first solid matter becomes equal to or less than the threshold value or disappears from the infrared spectrum, it can be determined that the neutralizing decomposition of the side-product has completed and treatment of making the side-product unhazardous has completed.

Alternatively, the degree of progress of the hydrolysis treatment or the neutralizing decomposition treatment can be grasped by comparing the absorbance I1 of the local maximum value related to the side-product extracted under an inert atmosphere with the absorbance I1 of the local maximum value related to the first solid matter. The infrared spectrum of the side-product extracted under an inert atmosphere can be obtained by, for example, a microreflection method.

3-1-1) Example 1 of Determination Method by Infrared Spectroscopic Analysis

As a result of diligent research, the present inventors have found that the degree of progress of the treatment of the side-product can be determined by setting the threshold value for the absorbance I1 of the local maximum value in the range of the wavenumber of 800 $cm^{-1}$ or more and 900 $cm^{-1}$ or less as follows.
  (1) When the absorbance I1 is 0.050 or less: It can be presumed that almost no Si—Cl bond exists in the first solid matter. Therefore, it can be determined that the neutralizing decomposition of the side-product has completed and the treatment of making the side-product unhazardous has completed.
  (2) When the absorbance I1 is more than 0.050 and 0.10 or less: It is considered that a part of the Si—Cl bonds is left remaining inside the first solid matter. Therefore, it can be determined that only the hydrolysis of the side-product has completed and a part of the treatment of the side-product has not completed.
  (3) When the absorbance I1 is more than 0.10: It is considered that many Si—Cl bonds are left remaining in the first solid matter. Therefore, it can be determined that neither the hydrolysis nor the neutralizing decomposition of the side-product has completed and the treatment of the side-product has not completed.

3-1-2) Example 2 of Determination Method by Infrared Spectroscopic Analysis

Furthermore, as a result of diligent research, the present inventors have found that the degree of progress of the treatment of the side-product can be determined by comparing the absorbance I1 of the local maximum value with the absorbance I2 of the local minimum value located on the higher wavenumber side than the absorbance I1 and in the range of the wavenumber of 900 $cm^{-1}$ or more and 1000 $cm^{-1}$ or less. To be more specific, the degree of progress of the treatment of the side-product can be determined by setting a threshold value as shown below for a value (I1-I2) obtained by subtracting the absorbance I2 of the local minimum value from the absorbance I1 of the local maximum value.
  (1) When the value (I1-I2) is 0.001 or less: It can be determined that the neutralizing decomposition of the side-product has completed and the treatment of making the side-product unhazardous has completed.
  (2) When the value (I1-I2) is more than 0.001 and the absorbance I2 of the local minimum value is 0.130 or less: It can be determined that only the hydrolysis of the side-product has completed and a part of the treatment of the side-product has not completed.
  (3) When the value (I1-I2) is more than 0.001 and the absorbance I2 of the local minimum value is more than 0.130: It can be determined that neither the neutralizing decomposition nor the hydrolysis of the side-product has completed and the treatment for achieving unhazardous has not completed.

The absorbance I1 of the local maximum value and the absorbance I2 of the local minimum value are heights from the baseline. The baseline is the lowest absorbance in the infrared spectrum.

3-2) Determination Method Using Raman Spectroscopic Analysis

First, a measurement sample is obtained by the same method as that described in the determination method according to the infrared spectroscopic analysis. Next, micro laser-Raman spectroscopic analysis is performed on the measurement sample to obtain a Raman spectrum. As the micro laser-Raman spectroscopic analyzer, for example, NRS-5100MS manufactured by JASCO Corporation is used. In the analysis, for example, the laser wavelength is set to 532 nm, the measurement range is set to 8.2 $cm^{-1}$ or more and 4000 $cm^{-1}$ or less, the resolution is set to 3.4 $cm^{-1}$, the cumulative number of times is set to 10, and the exposure time is set to 5 seconds. The obtained Raman spectrum is preferably subjected to baseline correction and smoothing treatment.

In the obtained Raman spectrum, the peak derived from the Si—H bond is considered to appear in the range of the Raman shift of 2000 $cm^{-1}$ or more and 2500 $cm^{-1}$ or less. The intensity R1 of the peak appearing in this range is considered to correlate with the amount of Si—H bonds contained in the first solid matter. That is, if the intensity R1 of this peak is high, it can be determined that the amount of Si—H bonds contained in the first solid matter is large, and if the intensity R1 is low, it can be determined that the amount of Si—H bonds contained in the first solid matter is small. The peak intensity assigned to the Si—H bonds can also be referred to as a local maximum value in the range of the Raman shift of 2000 $cm^{-1}$ or more and 2500 $cm^{-1}$ or less.

The Si—H bonds may serve as an index of the acidity of the side-product. If many Si—H bonds are remaining in the first solid matter, this may indicate that the neutralizing decomposition of the side-product is not sufficient. Therefore, the degree of progress of the neutralizing decomposition of the side-product can be determined by using the signal related to the Si—H bonds as an index.

In addition, for example, the progress of the hydrolysis treatment or the neutralizing decomposition treatment can be kept track of by comparing the heights of the intensity R1 of the local maximum value in the Raman shift range from 2000 $cm^{-1}$ or more and 2500 $cm^{-1}$ or less in measurement samples that differ in elapsed time after mixing the side-product and the treatment fluid. Specifically, first, by the same method as described above, a Raman spectrum of the first solid matter is obtained, and the intensity R1-1 of the local maximum value is recorded. A Raman spectrum is then obtained for the first solid matter which has been in contact with the treatment fluid for a longer period of time, and the intensity R1-2 of the local maximum value is recorded. If the intensity R1-2 is lower than the intensity R1-1, it can be determined that the hydrolysis treatment or the neutralizing decomposition treatment has progressed. In addition, for example, this operation may be repeatedly performed at regular time intervals, and at the point in time when the intensity R1 of the first solid matter disappears from the Raman spectrum, it can be determined that the neutralizing decomposition of the side-product has completed and the treatment for making the side-product unhazardous has completed.

Alternatively, the degree of progress of the hydrolysis treatment or the neutralizing decomposition treatment can be grasped by comparing the intensity R1 of the local maximum value related to the side-product extracted under an inert atmosphere with the intensity R1 of the local maximum value related to the first solid matter.

3-2-1) Example of Determination Method by Raman Spectroscopic Analysis

In addition, as a result of diligent research, the present inventors have found that the degree of progress of the treatment of the side-product can be determined by comparing the intensity R1 having the first local maximum value in the Raman shift range of 2000 $cm^{-1}$ or more and 2500 $cm^{-1}$ or less with the intensity R2 having the second local maximum value in the Raman shift range of 2700 $cm^{-1}$ or more and 3500 $cm^{-1}$ or less. The second local maximum value in the Raman shift range of 2700 $cm^{-1}$ or more and 3500 $cm^{-1}$ or less is considered to correspond to a peak derived from a hydroxyl group (—OH) or a methyl group (—$CH_3$) contained in an organic base. To be more specific, the degree of progress of the treatment of the side-product can be determined by setting a threshold value for the ratio R1/R2 between the intensity R1 and the intensity R2 as described below.

(1) When the ratio R1/R2 is 1/5 or smaller (the ratio R1/R2 is 0.20 or smaller): It is considered that the Si—H bonds in the side-product are sufficiently broken. Therefore, it can be determined that the neutralizing decomposition of the side-product has completed and the treatment for achieving unhazardous has completed.

(2) When the ratio R1/R2 is larger than 1/5 (when the ratio R1/R2 is larger than 0.20): It is considered that the Si—H bonds in the side-product are not sufficiently broken. Therefore, it can be determined that the neutralizing decomposition of the side-product has not completed and the treatment for achieving unhazardous has not completed.

The intensity R1 of the first local maximum value and the intensity R2 of the second local maximum value are heights from the baseline. The base line is a line connecting spectra of portions that are presumed to have no peak.

3-3) Analysis Method Using Nuclear Magnetic Resonance Spectroscopic Analysis

For example, 0.2 g of a dried first solid matter and 2 mL of dehydrogenated heavy toluene (product number 21744-1A, manufactured by Kanto Chemical Co., Inc.) are mixed, and the mixture left to stand for 4 hours is used as a measurement sample. This measurement sample is dispensed into a sample tube with a J.YOUNG valve (S-5-600-JY-8) manufactured by Haruna Inc. The NMR sample tube is set in a NMR spectroscopic analyzer, and a $^{29}Si$ NMR spectrum is measured. As the NMR spectroscopic analyzer, for example, JNM-ECA800 manufactured by JEOL Ltd. can be used. In the measurement of the $^{29}Si$ NMR spectrum, for example, the cumulative number of times is set to 3500, and the measurement range is set to −500 ppm or more and 500 ppm or less.

In the obtained $^{29}Si$ NMR spectrum, the peak assigned to the Si—Cl bonds appears in a range of −40 ppm or more and 10 ppm or less according to one example, and appears in a range of −10 ppm or more and 5 ppm or less according to another example. The intensity of this peak is considered to correlate with the amount of the Si—Cl bonds contained in the first solid matter. That is, if the intensity of this peak is high, it can be determined that the amount of the Si—Cl bonds contained in the first solid matter is large, and if the intensity is low, it can be determined that the amount of the Si—Cl bonds contained in the first solid matter is small.

3-4) Others

The determination method described above may be performed by combining a plurality of chemical analyses. For example, by combining the infrared spectroscopic analysis and the Raman spectroscopic analysis described above, the progress of the treatment of the side-product can be determined more accurately.

In addition, the determination method using the signal of at least one of the Si-α bond and the Si—H bond as an index and a method using the pH of the treatment fluid as an index may be combined. That is, as described above, a hydrogen halide such as hydrogen chloride (HCl) may be formed when the side-product is brought into contact with the treatment fluid. Thus, the pH of the treatment fluid in the mixture of the first solid matter and the treatment fluid may decrease. It is considered that when the hydrogen halide, such as hydrogen chloride, is sufficiently neutralized, the treatment fluid in the mixture of the first solid matter and the treatment fluid would exhibit a pH greater than 7. Therefore, when the pH of the treatment fluid in the mixture of the first solid matter and the treatment fluid is greater than 7, it can be determined that the hydrogen halide, such as hydrogen chloride, in the treatment fluid has been neutralized. Further, when the pH of the treatment fluid in the mixture of the first solid matter and the treatment fluid is 12 or greater, it can be determined that the hydrogen halide, such as hydrogen chloride, in the treatment fluid has been sufficiently neutralized.

In addition, the determination method using the signal of at least one of the Si-α bond and the Si—H bond as an index and a method using the increased temperature of the treatment fluid as an index may be combined. That is, when the side-product and the treatment fluid are brought into contact with each other, the temperature of the treatment fluid may increase in the mixture of the side-product and the treatment fluid due to the neutralizing decomposition reaction or the hydrolysis reaction of the side-product. Therefore, the difference between the temperature of the treatment fluid before being brought into contact with the side-product and the temperature of the treatment fluid after being brought into contact with the side-product may serve as an index for determining the progress of the treatment of the side-product. For example, the temperature of the treatment fluid in the mixture of the side-product and the treatment fluid is continuously measured, and while the temperature is rising, it can be determined that the neutralizing decomposition or hydrolysis of the side-product is in progress.

By further combining this method with the measurement of the pH concentration described above, the safety of the treatment of the side-product can be determined. For example, in the mixture of the side-product and the treatment fluid, when neither the temperature increase nor the pH decrease of the treatment fluid occur, it can be determined that a sufficient amount of the base relative to the side-product is present and the neutralizing decomposition of the side-product has been sufficiently performed.

In the determination method according to the embodiment described above, the signal of at least one of the Si-α bond and the Si—H bond of the first solid matter is used as an index. Therefore, the progress of the treatment of the side-product can be determined.

[Treatment Method]

A treatment method according to an embodiment includes bringing the side-product into contact with a treatment fluid containing water to obtain a first solid matter; and determining progress of a treatment of the side-product based on a signal according to a chemical analysis of at least one of an Si-$\alpha$ bond and an Si—H bond, of the first solid matter.

That is, the endpoint of the side-product can be kept track of, by combining the determination method according to the embodiment described above with the treatment method of the side-product by the treatment fluid. According to such a method, it is possible to prevent the side-product from being erroneously taken out before the completion of the treatment for making the side-product unhazardous, and the operator can perform the treatment operation for the side-product more safely. In addition, since it is possible to prevent an excessive amount of base from being introduced and an excessive operation time from being required for the treatment of the side-product, the efficiency of the treatment of the side-product can be improved.

By combining the treatment method according to the embodiment with the above-described method of setting the threshold value of the signal, safety and efficiency can be further enhanced. That is, the treatment method according to the embodiment may include discontinuing the treatment of the side-product when the intensity of the signal is equal to or less than the threshold value. The method may include further adding more treatment fluid to the mixture of the first solid matter and the treatment fluid when the intensity exceeds the threshold value. Alternatively, the mixture of the first mixture and the treatment fluid may be left to stand for a period of time, in order to let the side-product and the treatment fluid sufficiently react with each other. Alternatively, the method may include further adding a basic aqueous solution having a higher pH as a treatment fluid.

As further specific examples, treatment methods when combining the above-described 3-1-1) Example 1 of Determination Method by Infrared Spectroscopic Analysis, 3-1-2) Example 2 of Determination Method by Infrared Spectroscopic Analysis, and 3-2-1) Example of Determination Method by Raman Spectroscopic Analysis with the treatment method according to the embodiment will be described below.

1-1) Treatment Method in Combination with Example 1 of Determination Method by Infrared Spectroscopic Analysis (1) When the absorbance I1 is 0.050 or less and it is determined that the treatment for making the side-product unhazardous has completed: The treatment of the side-product is discontinued. Thereafter, the first solid matter may be removed from the mixture of the treatment fluid and the first solid matter, and the first solid matter may be subjected to a treatment of combustion or disposal.

(2) When the absorbance I1 is more than 0.050 and 0.10 or less, and it is determined that a part of the treatment of the side-product has not completed: More treatment fluid is further added to the mixture of the first solid matter and the treatment fluid. Alternatively, the mixture of the first mixture and the treatment fluid is left to stand for a period of time, in order to let the side-product and the treatment fluid sufficiently react with each other. Alternatively, a basic aqueous solution having a higher pH is further added as a treatment fluid. Thereafter, the infrared spectroscopic analysis is preferably further performed on the first solid matter to examine the absorbance I1. This determination by further performing the infrared spectroscopic analysis is preferably repeated until the absorbance I1 becomes 0.050 or less.

(3) When the absorbance I1 is more than 0.10 and it is determined that the treatment of the side-product has not completed: More treatment fluid is further added to the mixture of the first solid matter and the treatment fluid. Alternatively, the mixture of the first mixture and the treatment fluid is left to stand for a period of time, in order to let the side-product and the treatment fluid sufficiently react with each other. Alternatively, a basic aqueous solution having a higher pH is further added as a treatment fluid. Thereafter, the infrared spectroscopic analysis is preferably further performed on the first solid matter to examine the absorbance I1. This determination by further performing the infrared spectroscopic analysis is preferably repeated until the absorbance I1 becomes 0.050 or less.

1-2) Treatment Method in Combination with Example 2 of Determination Method by Infrared Spectroscopic Analysis (1) When the value (I1-I2) is 0.001 or less and it is determined that the treatment for making the side-product unhazardous has completed: The treatment of the side-product is discontinued. Thereafter, the first solid matter may be removed from the mixture of the treatment fluid and the first solid matter, and the first solid matter may be subjected to a treatment of combustion or disposal.

(2) When the value (I1-I2) is more than 0.001 whereas the absorbance I2 of the local minimum value is 0.130 or less, and it is determined that a part of the treatment of the side-product has not completed: More treatment fluid is further added to the mixture of the first solid matter and the treatment fluid. Alternatively, the mixture of the first mixture and the treatment fluid is left to stand for a period of time, in order to let the side-product and the treatment fluid sufficiently react with each other. Alternatively, a basic aqueous solution having a higher pH is further added as a treatment fluid. Thereafter, the infrared spectroscopic analysis is preferably further performed on the first solid matter to examine the absorbance I1 and the value (I1-I2). This determination by further performing the infrared spectroscopic analysis is preferably repeated until the value (I1-I2) becomes 0.001 or less.

(3) When the value (I1-I2) is more than 0.001 whereas the absorbance I2 of the local minimum value is more than 0.130, and it is determined that the treatment for making the side-product unhazardous has not completed: More treatment fluid is further added to the mixture of the first solid matter and the treatment fluid. Alternatively, the mixture of the first mixture and the treatment fluid is left to stand for a period of time, in order to let the side-product and the treatment fluid sufficiently react with each other. Alternatively, a basic aqueous solution having a higher pH is further added as a treatment fluid. Thereafter, the infrared spectroscopic analysis is preferably further performed on the first solid matter to examine the absorbance I1 and the value (I1-I2). This determination by further performing the infrared spectroscopic analysis is preferably repeated until the value (I1-I2) becomes 0.001 or less.

1-3) Treatment Method in Combination with Example of Determination Method by Raman Spectroscopic Analysis (1) When the ratio R1/R2 is 1/5 or smaller and it is determined that the treatment for making the side-product unhazardous has completed: The treatment of the side-product is discontinued. Thereafter, the first solid matter may be removed from the mixture of the treatment fluid and the first solid matter, and the first solid matter may be subjected to a treatment of combustion or disposal.

(2) When the ratio R1/R2 is larger than 1/5 and it is determined that the treatment for making the side-product unhazardous has not completed: More treatment fluid is further added to the mixture of the first solid matter and the basic aqueous solution. Alternatively, the mixture of the first mixture and the treatment fluid is left to stand for a period of time, in order to let the side-product and the treatment fluid sufficiently react with each other. Alternatively, a basic aqueous solution having a higher pH is further added as a treatment fluid. Thereafter, the Raman spectroscopic analysis is preferably further performed on the first solid matter to examine the ratio R1/R2. This determination by further performing the Raman spectroscopic analysis is preferably repeated until the ratio R1/R2 becomes 1/5 or smaller.

2) Two-Stage Treatment Method

The treatment method according to the embodiment may be performed in two stages of a pretreatment of the side-product with water and a main treatment with a basic aqueous solution. The treatment method may include bringing the side-product into contact with water to obtain a second solid matter, bringing the second solid matter into contact with a basic aqueous solution to obtain a third solid matter, and determining the degree of progress of the treatment of the side-product based on a signal from a chemical analysis of at least one of an Si-$\alpha$ bond and an Si—H bond, for the third solid matter. The second solid matter may be a hydrolysis product of the side-product. The third solid matter may be a neutralized decomposition product of the side-product.

The treatment method may further include bringing the basic aqueous solution into contact with the second solid matter based on a signal from a chemical analysis of at least one of an Si-$\alpha$ bond and an Si—H bond, for the second solid matter.

According to this treatment method, the side-product can be treated more moderately.

As further specific examples, treatment methods when combining the above-described 3-1-1) Example 1 of Determination Method by Infrared Spectroscopic Analysis, 3-1-2) Example 2 of Determination Method by Infrared Spectroscopic Analysis, and 3-2-1) Example of Determination Method by Raman Spectroscopic Analysis with the Treatment Method According to the Embodiment Will be Described Below.

2-1) Treatment Method in Combination with Example 1 of Determination Method by Infrared Spectroscopic Analysis (1) When the absorbance I1 of the second solid matter is more than 0.050 and 0.10 of less, and it is determined that part of the treatment for making the side-product unhazardous has not completed: The basic aqueous solution is further added to the mixture of the second solid matter and water to obtain a third solid matter.

(2) When the absorbance I1 of the second solid matter is more than 0.10 and it is determined that the treatment for making the side-product unhazardous has not completed: More water is further added to the mixture of the second solid matter and water. Alternatively, the mixture of the second mixture and water is left to stand, in order to let the side-product and water sufficiently react with each other. Alternatively, the basic aqueous solution is further added to the mixture of the second solid matter and water to obtain a third solid matter.

(3) When the absorbance TI of the second solid matter or the third solid matter is 0.050 or less and it is determined that the treatment for making the side-product unhazardous has completed: The treatment of the side-product is discontinued. Thereafter, the second solid matter or the third solid matter may be removed from the mixture of the second solid matter and water or the mixture of the third solid matter and the basic aqueous solution, and the second solid matter or the third solid matter may be subjected to a treatment of combustion or disposal.

(4) When the absorbance I1 of the third solid matter is more than 0.10 and it is determined that the treatment for making the side-product unhazardous has not completed, or when the absorbance I1 of the third solid matter is more than 0.050 and 0.10 or less and it is determined that part of the treatment for making the side-product unhazardous has not completed: More basic aqueous solution is further added to the mixture of the third solid matter and the basic aqueous solution. Alternatively, the mixture of the third mixture and the basic aqueous solution is left to stand for a period of time, in order to let the side-product and the basic aqueous solution sufficiently react with each other. Alternatively, a basic aqueous solution having a higher pH is further added. Thereafter, the infrared spectroscopic analysis is preferably further performed on the third solid matter to examine the absorbance I1. This determination by further performing the infrared spectroscopic analysis is preferably repeated until the absorbance I1 becomes 0.050 or less.

2-2) Treatment Method in Combination with Example 2 of Determination Method by Infrared Spectroscopic Analysis (1) When the value (I1-I2) of the second solid matter is more than 0.001 whereas the absorbance I2 of the local minimum value is 0.130 or less, and it is determined that part of the treatment of the side-product has not completed: The basic aqueous solution is further added to the mixture of the second solid matter and water to obtain a third solid matter.

(2) When the value (I1-I2) of the second solid matter is more than 0.001 whereas the absorbance I2 of the local minimum value is more than 0.130, and it is determined that the treatment for making the side-product unhazardous has not completed: More water is further added to the mixture of the second solid matter and water. Alternatively, the mixture of the second mixture and water is left to stand, in order to let the side-product and water sufficiently react with each other. Alternatively, the basic aqueous solution is further added to the mixture of the second solid matter and water to obtain a third solid matter. Thereafter, the infrared spectroscopic analysis is preferably further performed on the second solid matter or the third solid matter to examine the absorbance I1 and the value (I1-I2). This determination by further performing the infrared spectroscopic analysis is preferably repeated until the value (I1-I2) becomes 0.001 or less.

(3) When the value (I1-I2) of the second solid matter or the third solid matter is 0.001 or less and it is determined that the treatment for making the side-product unhazardous has completed: The treatment of the side-product is discontinued. Thereafter, the second solid matter or the third solid matter may be removed from the mixture of the second solid matter and water or the mixture of the third solid matter and the basic aqueous solution, and the second solid matter or the third solid matter may be subjected to a treatment of combustion or disposal.

(4) When the value (I1-I2) of the third solid matter is more than 0.001 whereas the absorbance I2 of the local minimum value is 0.130 or less, and it is determined that part of the treatment of the side-product has not completed, and when the value (I1-I2) is more than 0.001 whereas the absorbance I2 of the local minimum value is more than 0.130, and it is determined that the treatment for making the side-product unhazardous has not completed: More basic aqueous solution is further added to the mixture of the third solid matter and the basic aqueous solution. Alternatively, the mixture of the third mixture and the basic aqueous solution is left to stand, in order to let the side-product and the basic aqueous solution sufficiently react with each other. Alternatively, a basic aqueous solution having a higher pH is further added. Thereafter, the infrared spectroscopic analysis is preferably further performed on the third solid matter to examine the absorbance I1 and the value (I1-I2). This determination by further performing the infrared spectroscopic analysis is preferably repeated until the value (I1-I2) becomes 0.001 or less.

2-3) Treatment Method in Combination with Example of Determination Method by Raman Spectroscopic Analysis (1) When the ratio R1/R2 of the second solid matter is larger than 1/5 and it is determined that the treatment for making the side-product unhazardous has not completed: The basic aqueous solution is further added to the mixture of the second solid matter and water to obtain a third solid matter.

(2) When the ratio R1/R2 of the second solid matter or the third solid matter is 1/5 or smaller, and it is determined that the treatment for making the side-product unhazardous has completed: The treatment of the side-product is discontinued. Thereafter, the second solid matter or the third solid matter may be removed from the mixture of the second solid matter and water or the mixture of the third solid matter and the basic aqueous solution, and the second solid matter or the third solid matter may be subjected to a treatment of combustion or disposal.

(3) When the ratio R1/R2 of the third solid matter is larger than 1/5, and it is determined that the treatment for making the side-product unhazardous has not completed: More basic aqueous solution is further added to the mixture of the third solid matter and the basic aqueous solution. Alternatively, the mixture of the third mixture and the basic aqueous solution is left to stand, in order to let the side-product and the basic aqueous solution sufficiently react with each other. Alternatively, a basic aqueous solution having a higher pH is further added. Thereafter, the Raman spectroscopic analysis is preferably further performed on the third solid matter to examine the ratio R1/R2. This determination by further performing the Raman spectroscopic analysis is preferably repeated until the ratio R1/R2 becomes 1/5 or smaller.

3) Others

The treatment method according to the embodiment may be used in combination with the method using the pH of the treatment fluid as an index, in addition to the determination method using the signal of at least one of the Si-α bond and the Si—H bond as an index. Namely, in the above-described method, in addition to the case where the intensity of the signal is equal to or less than the threshold value, the treatment of the side-product may be discontinued when the pH of the treatment fluid in the mixture of the first solid matter or the third solid matter and the treatment fluid is greater than 7, or alternatively, equal to or greater than 12. Furthermore, when the pH of the treatment fluid in the mixture of the first solid matter or the third solid matter and the treatment fluid is lower than 12, or alternatively, equal to or less than 7, a treatment of further adding the basic aqueous solution to the mixture may be performed.

In addition to the determination method using the signal of at least one of the Si-α bond and the Si—H bond as an index, a method using a temperature change of the treatment fluid as an index may be used in combination. Specifically, in the above-described method, the temperature change of the treatment fluid in the mixture of the first solid matter or the third solid matter and the treatment fluid may be measured, and the treatment of the side-product may be discontinued at the point when the temperature change stops or when the temperature stops increasing and starts decreasing, in addition to the intensity of the signal being equal to or less than the threshold value. Alternatively, when the temperature of the treatment fluid in the mixture of the first solid matter or the third solid matter and the treatment fluid becomes increased by a predetermined temperature from the temperature before mixing with the side-product, further addition of the treatment fluid may be carried out, or addition of a treatment fluid having a higher pH may be carried out.

In addition, the treatment method according to the embodiment may include performing a pulverization treatment such as ultrasonic treatment on the mixture of the first solid matter and the treatment fluid, the mixture of the second solid matter and water, or the mixture of the third solid matter and the basic aqueous solution.

The treatment method according to the embodiment described above uses the determination method according to the embodiment. Therefore, when the treatment method according to the embodiment is used, the treatment of the side-product can be performed more safely and more efficiently.

EXAMPLES

Hereinafter, examples will be described.

[Preparation of Samples A to D]

First, a raw material gas was introduced into an epitaxial growing apparatus and reacted with a silicon substrate at a temperature of 800° C. to form a single-crystal silicon film on the silicon substrate. As the raw material gas, a mixed gas obtained by mixing hydrogen gas with dichlorosilane and hydrogen chloride was used. The concentration of hydrogen in the mixed gas was 95% by volume or more.

Next, the piping of the epitaxial growing apparatus was disassembled under a nitrogen atmosphere, and a side-product was extracted as Sample A. The side-product was a white, creamy liquid. When the extracted side-product was analyzed by a nuclear magnetic resonance spectroscopic analysis and mass spectrometry, it was confirmed that the side-product contained chlorosilanes having a ring structure which are considered to correspond to the structural formulae (e) to (h).

Next, inside an argon-substituted glove box, 50 mg of the side-product was dispensed into each of three petri dishes. These petri dishes were placed in an airtight container and moved to a draft chamber under an air atmosphere. The temperature of the draft chamber was 26.4° C. and the humidity was 55%.

The three petri dishes were taken out from the airtight container, and 1.0 mL of water was added to the first petri dish and brought into contact with the side-product to obtain a mixture of the first solid matter and water. After a lapse of 60 minutes, the first solid matter was taken out from the mixture and dried to obtain Sample B. This treatment was carried out while measuring the temperature in the treatment fluid using a thermometer.

1.0 mL of a basic aqueous solution was added to the second petri dish and brought into contact with the side-product to obtain a mixture of the first solid matter and the basic aqueous solution. After a lapse of 60 minutes, the first solid matter was taken out from the mixture and dried to obtain Sample C. This treatment was carried out while measuring the temperature in the treatment fluid using a thermometer. As the basic aqueous solution, a solution obtained by dissolving tetramethylammonium hydroxide (TMAH) in water was used. In the basic aqueous solution, the concentration of TMAH was 0.5% by mass, and the pH thereof was 12.

The side-product in the third petri dish was left in the draft chamber under an air atmosphere for 60 minutes to have the side-product react with air, thereby obtaining the first solid matter. This first solid matter was referred to as Sample D.

[Explosivility and Inflammability Examination Test]

Explosivility and inflammability of Samples B to D were examined by the following method. First, the samples were placed in a metal container. A spatula made of SUS was pressed against the sample and moved in the metal container, and whether or not the first solid matter ignited was visually examined. When the first solid matter ignited, the first solid matter was determined to be explosive, and when the first solid matter did not ignite, the first solid matter was determined not to be explosive.

In addition, a flame was brought into contact with the sample dispensed in the metal container using a portable ignition device, and whether or not ignition occurred was visually examined. The temperature of the flame was about 500° C. When the first solid matter ignited, the first solid matter was determined to be inflammable, and when the first solid matter did not ignite, the first solid matter was determined not to be inflammable.

When the first solid matter was neither explosive nor inflammable, it was determined that the unhazardous-making treatment had completed; when the first solid matter was either explosive or inflammable, it was determined that part of the treatment for achieving unhazardous had not completed; and when the first solid matter was both explosive and inflammable, it was determined that the treatment for achieving unhazardous had not completed. Note that Sample A was assumed to be both explosive and inflammable. The determination results are shown in Table 1.

(pH Measurement)

The pH of water and the basic aqueous solution before treatment of the side-product and the pH of the water or the basic aqueous solution in the mixture of the first solid matter and the water or the basic aqueous solution were measured using pH test paper. The results are shown in Table 1.

[Infrared Spectroscopic Analysis]

Figure 5:
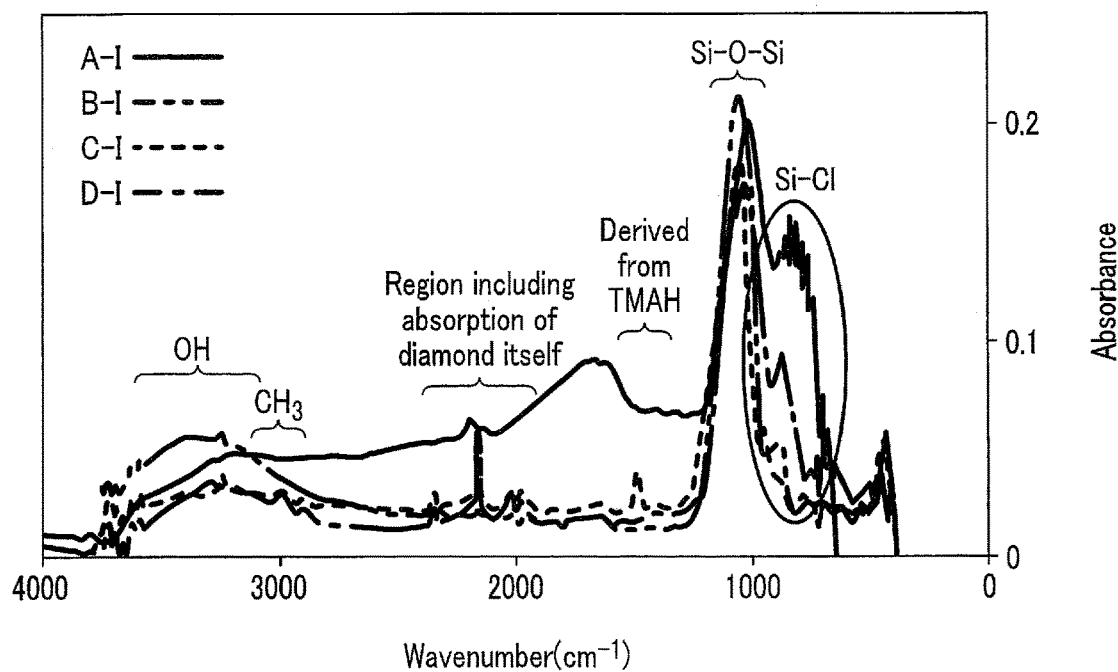
FIG. 5 is a graph showing an example of infrared spectra of Samples A to D.
Figure 6:
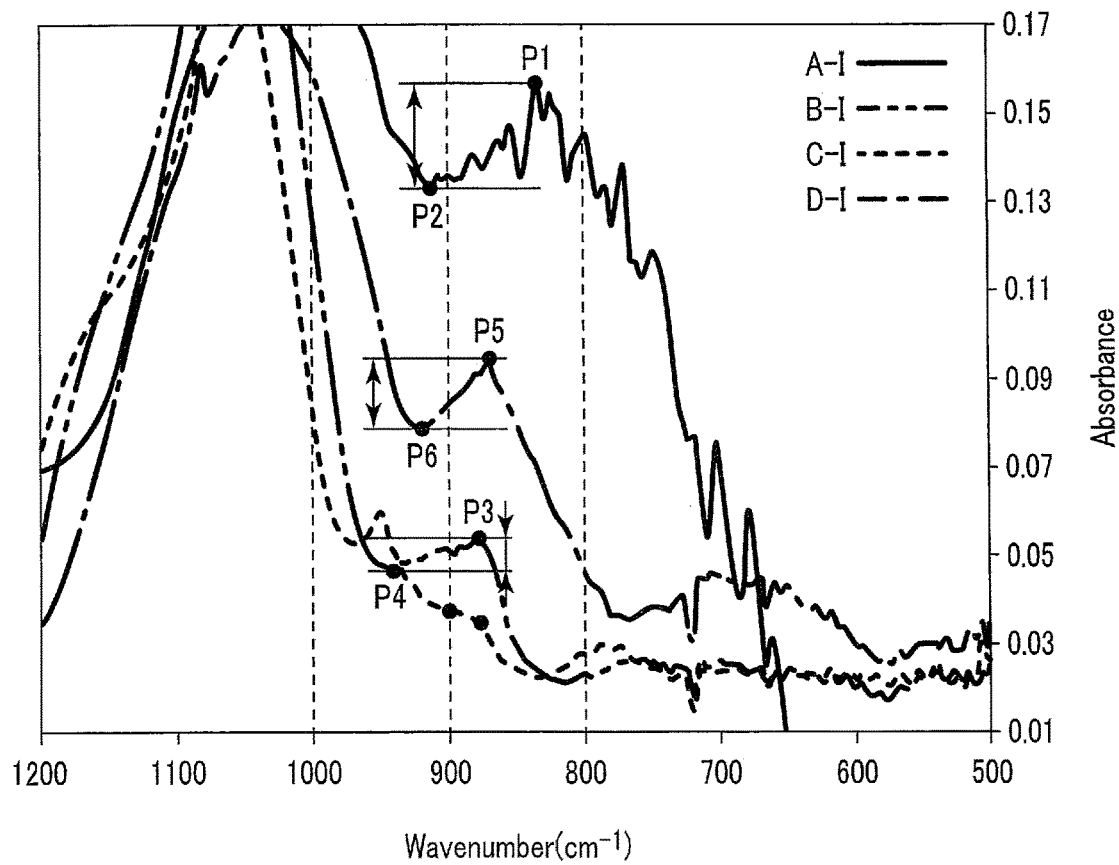
FIG. 6 is an enlarged graph of a part of the graph shown in FIG. 5.

Samples B to D were subjected to the infrared spectroscopic analysis under the conditions described above to obtain infrared spectra of each of the samples. For Sample A, the infrared spectrum was obtained by a microscopic IR method. Note that IRT-7000 manufactured by JASCO Corporation was used as an accessory, the measurement range was 650 cm$^{-1}$ or more and 4000 cm$^{-1}$ or less, the resolution was 4 cm$^{-1}$, and the cumulative number of times was 100. The results are shown in FIGS. 5 and 6. FIG. 5 is a graph showing an example of infrared spectra according to Samples A to D. FIG. 6 is an enlarged graph of a part of the graph shown in FIG. 5. In FIGS. 5 and 6, the horizontal axis represents a wavenumber and the vertical axis represents absorbance. In FIGS. 5 and 6, A-I, B-I, C-I, and D-I represent infrared spectra of Sample A, Sample B, Sample C, and Sample D, respectively. In the infrared spectra shown in FIGS. 5 and 6, the absorbance at the baseline is 0.

In the graph shown in FIG. 5, it is considered that peaks appearing in the range of 2900 cm$^{-1}$ or more and 3700 cm$^{-1}$ or less are derived from a hydroxyl group (—OH), peaks appearing in the range of 2700 cm$^{-1}$ or more and 3000 cm$^{-1}$ or less are derived from a methyl group (—CH$_3$), and the range of 2000 cm$^{-1}$ or more and 2400 cm$^{-1}$ or less is a region including absorption by the diamond prism itself, peaks appearing in the range of 1500 cm$^{-1}$ or more and 1700 cm$^{-1}$ or less is derived from TMAH, peaks appearing in the range of 900 cm$^{-1}$ or more and 1300 cm$^{-1}$ or less is derived from an Si—O—Si bond, and peaks appearing in the range of 800 cm$^{-1}$ or more and 900 cm$^{-1}$ or less is derived from an Si—Cl bond. Peaks appearing in the range of 800 cm$^{-1}$ or more and 900 cm$^{-1}$ or less may possibly be derived from a Si—Si bond. In FIG. 5, peaks associated with an Si—Cl bond are circled.

In the graph shown in FIG. 6, points P1 and P2 respectively indicate the local maximum value I1 and the local minimum value I2 of Sample A. Points P3 and P4 respectively indicate the local maximum value I1 and the local minimum value I2 of Sample B. Points P5 and P6 respectively indicate the local maximum value I1 and the local minimum value I2 of Sample D. In Sample C, the absorbance at the local maximum value I1 was equal to the absorbance at the local minimum value I2.

As is clear from FIG. 6, almost no peak derived from the Si—Cl bond was observed in the infrared spectrum of Sample C. On the other hand, peaks derived from an Si—Cl bond were observed in the infrared spectra of Samples A, B, and D. The magnitude of this peak was larger in the order of Sample A, Sample D, and Sample B.

The local maximum value I1, the local minimum value I2, and the value (I1-I2) were calculated from each infrared spectroscopic spectrum, and it was determined whether or not the treatment for achieving unhazardous was completed for Samples A to D based on Examples 1 and 2 of the determination method by the infrared spectroscopic analysis described above. The results are shown in Table 2.

[Raman Spectroscopic Analysis]

Figure 7:
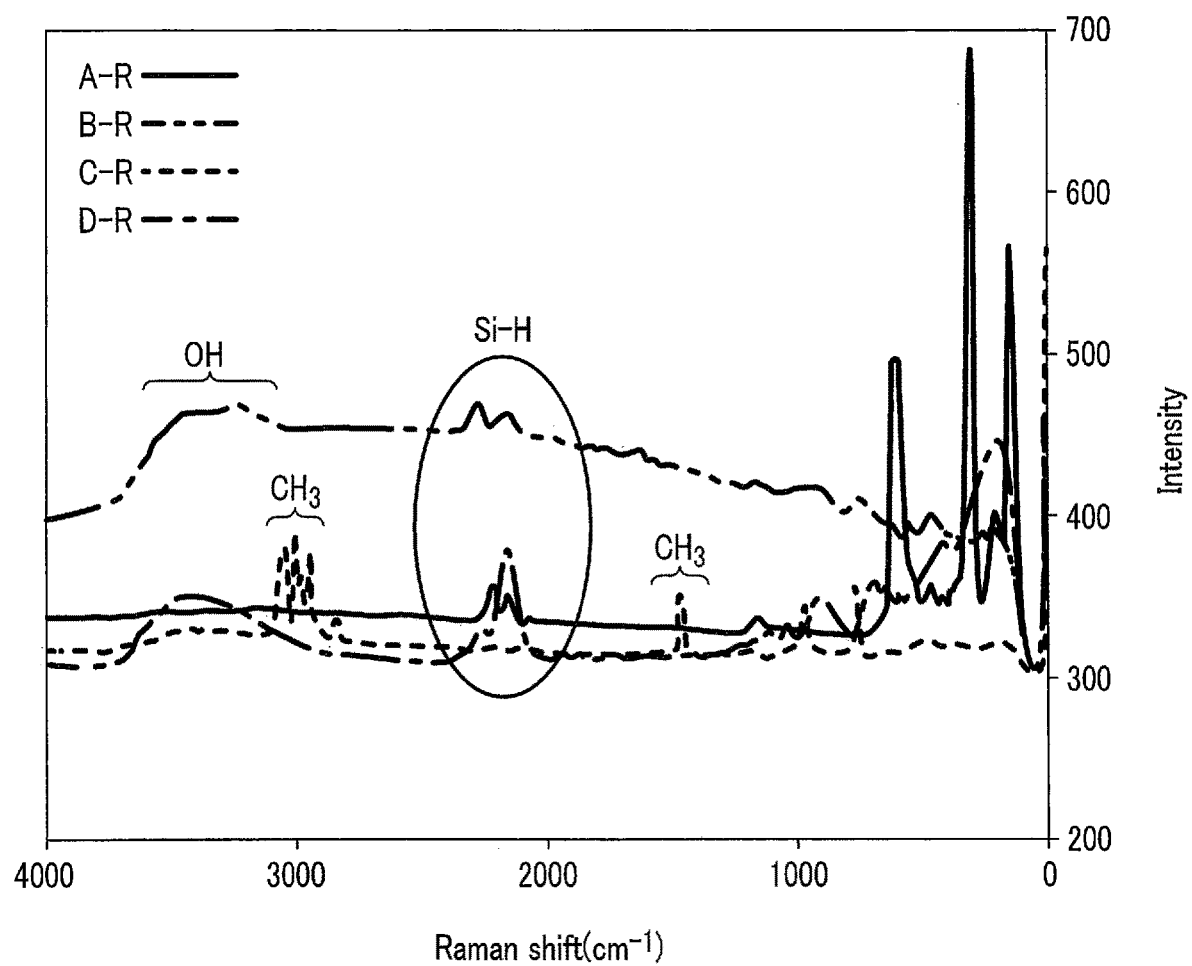
FIG. 7 is a graph showing an example of Raman spectra of Samples A to D.
Figure 8:
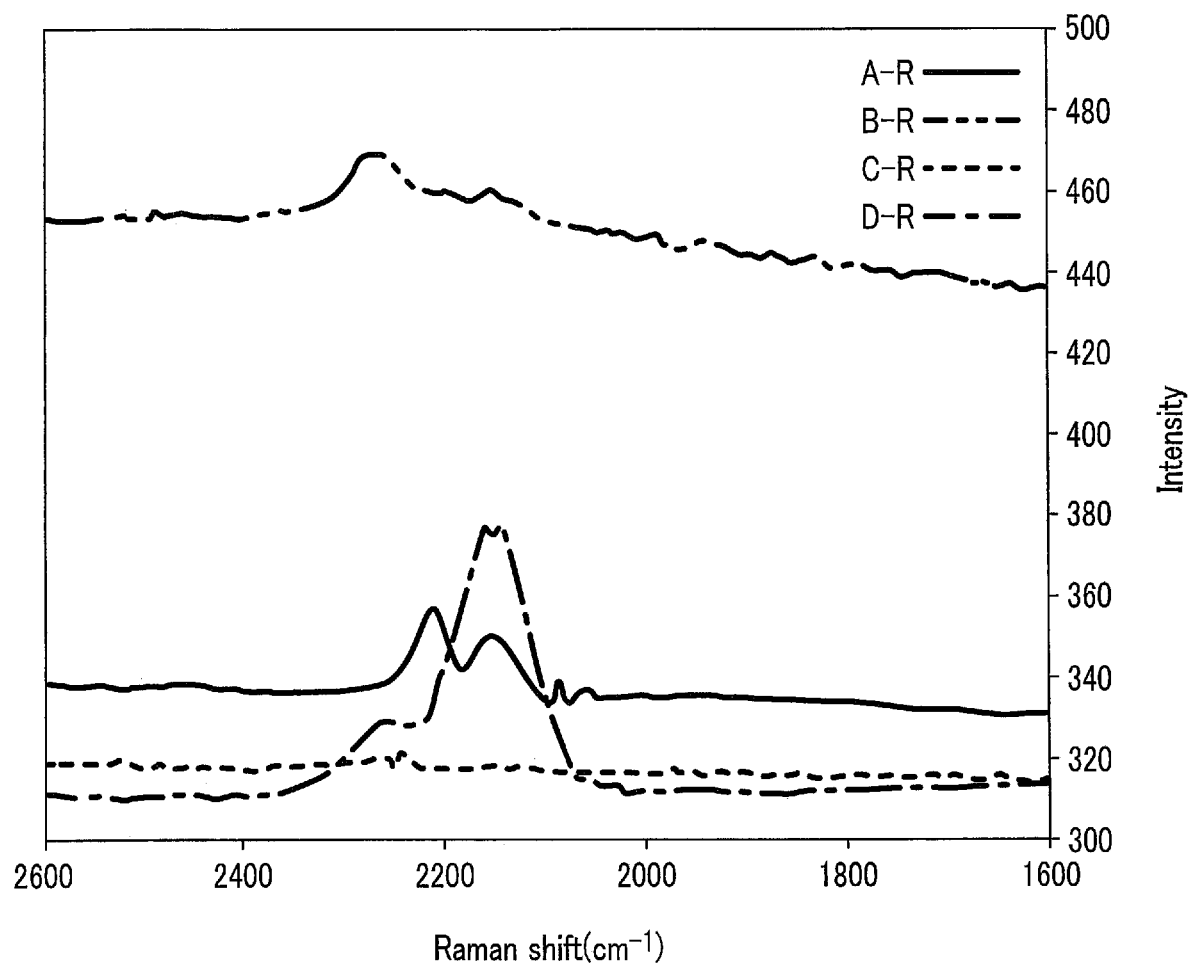
FIG. 8 is an enlarged graph of a part of the graph shown in FIG. 7.

Samples A to D were subjected to the Raman spectroscopic analysis under the conditions described above to obtain Raman spectra of each sample. The results are shown in FIGS. 7 and 8. FIG. 7 is a graph showing an example of Raman spectra of Samples A to D. FIG. 8 is an enlarged graph of a part of the graph shown in FIG. 7. In FIGS. 7 and 8, the horizontal axis represents Raman shift, and the vertical axis represents intensity. In FIGS. 7 and 8, A-R, B-R, C-R, and D-R represent the Raman spectra of Sample A, Sample B, Sample C, and Sample D, respectively.

In the graph shown in FIG. 7, it is considered that peaks appearing in the range of 3200 cm$^{-1}$ or more and 3800 cm$^{-1}$ or less are derived from a hydroxyl group (—OH), peaks appearing in the range of 1400 cm$^{-1}$ or more and 1600 cm$^{-1}$ or less and the range of 2700 cm$^{-1}$ or more and 3200 cm$^{-1}$ or less are derived from a methyl group (—CH$_3$), and peaks appearing in the range of 2000 cm$^{-1}$ or more and 2500 cm$^{-1}$ or less is derived from an Si—H bond. In FIG. 7, peaks associated with an Si—H bond are circled.

As shown in FIG. 8, almost no peak derived from the Si—H bond was observed in the Raman spectrum of Sample C. On the other hand, peaks derived from Si—H bonds were observed in the Raman spectra of Samples A, B, and D. Furthermore, an influence by fluorescence appeared in the Raman spectrum of Sample B.

An intensity R1, an intensity R2, and a ratio R1/R2 were calculated based on the above-described example of the determination method by the Raman spectroscopic analysis, and it was determined whether or not the treatment for achieving unhazardous had been completed for Samples A to D. The results are shown in Table 3.

Tables 1 to 3 below show the results of the determination methods.

TABLE 1

|  | Treatment Method | Explosivility | Inflammability | pH Before Treatment | pH After Treatment | Maximum Temperature (° C.) | Determination |
|---|---|---|---|---|---|---|---|
| Sample A | Untreated | Yes | Yes | — | — | — | Incomplete |
| Sample B | Water | No | Yes | 7 | 1 | 32.4 | Partially Incomplete |
| Sample C | Basic Aqueous Solution | No | No | 12 | 11 | 23.5 | Complete |
| Sample D | Air | No | Yes | — | — | — | Partially Incomplete |

In Table 1 above, the column labeled "Treatment Method" describes characteristics upon preparing each sample. In the columns labeled "Explosivility" and "Inflammability", the results of the explosivility and inflammability examination test of the respective samples are described. In addition, the column labeled "pH Before Treatment" describes the pH of water and the basic treatment fluid used in the treatment of the side-product. The column labeled "pH After Treatment" describes the pH of the water or the basic aqueous solution in the mixture of the first solid matter and water or the basic aqueous solution. The column labeled "Maximum Temperature (° C.)" describes the highest temperature reached by the treatment fluid during the treatment of the side-product. In addition, in the column labeled "Determination", "Incomplete" is indicated when each sample is explosive and inflammable, "Partially Incomplete" is indicated when each sample is either explosive or inflammable, and "Complete" is indicated when each sample is neither explosive nor inflammable.

TABLE 2

|  | Treatment Method | IR Determination Method 1 | | IR Determination Method 2 | | |
|---|---|---|---|---|---|---|
|  |  | I1 | Determination | I2 | I1 − I2 | Determination |
| Sample A | Untreated | 0.154 | Incomplete | 0.134 | 0.02 | Incomplete |
| Sample B | Water | 0.052 | Partially Incomplete | 0.048 | 0.004 | Partially Incomplete |
| Sample C | Basic Aqueous Solution | 0.037 | Complete | 0.037 | — | Complete |
| Sample D | Air | 0.092 | Partially Incomplete | 0.079 | 0.013 | Partially Incomplete |

In Table 2 above, the column labeled "Treatment Method" describes characteristics upon preparation of each sample. Of the columns below the heading "IR Determination Method 1", the column labeled "I1" describes the absorbance I1 of the local maximum value in the range of the wavenumber of 800 $cm^{-1}$ or more and 900 $cm^{-1}$ or less in the infrared spectrum of each sample. In the column labeled "Determination", "Complete" is indicated when the absorbance I1 of the local maximum value is 0.050 or less, "Partially Incomplete" is indicated when the absorbance I1 of the local maximum value is more than 0.050 and 0.10 or less, and "Incomplete" is indicated when the absorbance I1 of the local maximum value is more than 0.10.

In the above Table 2, of the columns below the heading "IR Determination Method 2", the column labeled "I2" describes the absorbance I2 of the local minimum value in the range of the wavenumber of 900 $cm^{-1}$ or more and 1000 $cm^{-1}$ or less in the infrared spectrum of each sample. The column labeled "I1-I2" indicates the value obtained by subtracting the absorbance I2 of the local minimum value from the absorbance I1 of the local maximum value. In the column labeled "Determination", "Complete" is indicated when the value (I1-I2) is 0.001 or less, "Partially Incomplete" is indicated when the value (I1-I2) is greater than 0.001 and the absorbance I2 of the local minimum value is 0.130 or less, and "Incomplete" is indicated when the value (I1-I2) is greater than 0.001 and the absorbance I2 of the local minimum value is greater than 0.130.

TABLE 3

|  | Treatment Method | Raman Determination Method | | | |
|---|---|---|---|---|---|
|  |  | R1 | R2 | R1/R2 | Determination |
| Sample A | Untreated | 18 | 8 | 2.25 | Incomplete |
| Sample B | Water | 17.6 | 19.7 | 0.89 | Incomplete |
| Sample C | Basic Aqueous Solution | 2.5 | 71.7 | 0.03 | Complete |
| Sample D | Air | 65.4 | 39.8 | 1.64 | Incomplete |

In Table 3 above, the column labeled "Treatment method" describes characteristics upon preparation of each sample. Of the columns below the heading "Raman Determination Method", the column labeled "R1" describes the intensity of the local maximum value in the range of the Raman shift of 2000 $cm^{-1}$ or more and 2500 $cm^{-1}$ or less in the Raman spectrum of each sample. The column labeled "R2" describes the intensity of the peak derived from the OH group in the range of the Raman shift of 2700 cm$^{-1}$ or more and 3500 cm$^{-1}$ or less in the Raman spectrum of each sample. The column labeled "R1/R2" describes the ratio of the intensity R1 of the local maximum value to the intensity R2 of the peak derived from the OH group. In the column labeled "Determination", "Complete" is indicated when the ratio R1/R2 is 1/5 or less, and "Incomplete" is indicated when the ratio R1/R2 is greater than 1/5.

As shown in Tables 1 and 2 above, when the determination methods 1 and 2 by the infrared spectroscopic analysis were used, the same results as in the case of examining the explosivity and inflammability of each sample had been obtained. In addition, as shown in Tables 1 and 3, when the determination method by the Raman spectroscopic analysis was used, the same results as in the case of examining the explosivity and inflammability of each sample had been obtained in terms of whether or not the treatment of the side-product had been completed.

The determination method according to the embodiment described above uses at least one signal of the Si—α bond and the Si—H bond of the first solid matter, as an index. Therefore, the progress of treatment of the side-product can be determined.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A method for decomposition of a hazardous side-product produced in an apparatus by a process of reacting a substance containing a halogen and silicon or reacting a substance containing silicon and a substance containing a halogen, comprising:
   treating the side product by contacting the side-product with a treatment fluid containing water to obtain a solid matter;
   determining if the side product is hazardous by performing a chemical analysis comprising an infrared spectroscopic analysis of the solid matter to obtain values I1, I2 and (I1−I2);
   comparing the obtained values to threshold values (I1−I2) and I2;
   continuing the treatment when the obtained values (I1−I2) and I2 are greater than the threshold values and repeating the analysis of the solid matter; or
   ending the treatment when the obtained values (I1−I2) and I2 are equal to the threshold values or less which indicates the side product is decomposed and no longer hazardous, and
   removing the decomposed side product from the apparatus,
   wherein
   the infrared spectroscopic analysis relates to
   an Si-α bond wherein α is at least one selected from the group consisting of F, Cl, Br, and I, of the first solid matter;
   wherein I1 is an absorbance of a local maximum value in a range of a wavenumber 800 cm$^{-1}$ or more and 900 cm$^{-1}$ or less, and I2 is an absorbance of a local minimum value in a range of a wavenumber of 900 cm$^{-1}$ or more and 1000 cm$^{-1}$ or less and located at a higher wavenumber side than the local maximum value, in an infrared spectrum of the first solid matter,
   the threshold value of I2 is 0.130, and
   the threshold value of (I1−I2) is 0.001.

2. The method according to claim 1, wherein the treatment fluid is a basic aqueous solution.

3. The method according to claim 2, further comprising adding more of the treatment fluid to a mixture of the first solid matter and the treatment fluid when the value (I1−I2) is more than 0.001 and the absorption I2 of the local minimum value is 0.130 or less, or adding more of the treatment fluid to the mixture when the value (I1−I2) is more than 0.001 and the absorbance I2 of the local minimum value is more than 0.130.

4. The method according to claim 1, further comprising adding more of the treatment fluid to the mixture of the first solid matter and the treatment fluid when the value (I1−I2) is more than 0.001 and the absorption I2 of the local minimum value is 0.130 or less, or adding more of the treatment fluid to the mixture when the value (I1−I2) is more than 0.001 and the absorbance I2 of the local minimum value is more than 0.130.

5. The method according to claim 1, wherein the absorbance I1 is derived from an Si—Cl bond.

6. A method for decomposition of a hazardous side-product produced in an apparatus by a process of reacting a substance containing a halogen and silicon or reacting a substance containing silicon and a substance containing a halogen, comprising:
   bringing the side-product into contact with a treatment fluid containing water to obtain a solid matter;
   determining if the side product is hazardous by performing a chemical analysis comprising a Raman spectroscopic analysis of the solid matter to obtain a ratio R1/R2;
   comparing the obtained ratio R1/R2 to a threshold ratio R1/R2;
   continuing the treatment when the obtained ratio R1/R2 is greater than the threshold value and repeating the analysis of the solid matter; or
   ending the treatment when the obtained ratio R1/R2 is equal to the threshold value or less which indicates the side product is decomposed and no longer hazardous, and
   removing the decomposed side product from the apparatus,
   wherein
   the Raman spectroscopic analysis relates to
   an Si-α bond wherein a is at least one selected from the group consisting of F, Cl, Br, and I and an Si—H bond, of the first solid matter,
   R1 is an intensity of a first local maximum value in a range of a Raman shift of 2000 cm$^{-1}$ or more and 2500 cm$^{-1}$ or less,
   R2 is an intensity of a second local maximum value in a range of a Raman shift of 2700 cm$^{-1}$ or more and 3500 cm$^{-1}$ or less, in a Raman spectrum of the first solid matter, and
   the threshold value of the ratio R1/R2 is 1/5.

7. The method according to claim 6, wherein the treatment fluid is a basic aqueous solution.

8. The method according to claim 7, further comprising adding more of the treatment fluid to a mixture of the first solid matter and the treatment fluid when the ratio R1/R2 is greater than 1/5.

9. The method according to claim 7, wherein the intensity R1 is derived from the Si—H bond, and the intensity R2 is derived from a hydroxyl group or a methyl group.

10. The method according to claim 6, further comprising further adding more of the treatment fluid to a mixture of the first solid matter and the treatment fluid when the ratio R1/R2 is greater than 1/5.

11. The method according to claim 6, wherein the intensity R1 is derived from the Si—H bond, and the intensity R2 is derived from a hydroxyl group or a methyl group.

* * * * *